United States Patent
Moore et al.

(10) Patent No.: US 9,246,038 B2
(45) Date of Patent: Jan. 26, 2016

(54) LIGHT COLLECTING AND EMITTING APPARATUS, METHOD, AND APPLICATIONS

(75) Inventors: Duncan T. Moore, Fairport, NY (US); Greg R. Schmidt, Gates, NY (US); Michael Brown, Rochester, NY (US)

(73) Assignee: UNIVERSITY OF ROCHESTER, Rochester, NY (US)

( * ) Notice: Subject to any disclaimer, the term of this patent is extended or adjusted under 35 U.S.C. 154(b) by 572 days.

(21) Appl. No.: 13/462,047

(22) Filed: May 2, 2012

(65) Prior Publication Data

US 2013/0028565 A1 Jan. 31, 2013

Related U.S. Application Data

(63) Continuation-in-part of application No. 13/108,225, filed on May 16, 2011, now Pat. No. 8,189,970, and a continuation-in-part of application No. 12/490,417, filed on Jun. 24, 2009, now Pat. No. 8,498,505.

(51) Int. Cl.
*G02B 6/32* (2006.01)
*H01L 31/054* (2014.01)
*F21V 8/00* (2006.01)

(52) U.S. Cl.
CPC .......... *H01L 31/0547* (2014.12); *G02B 6/0018* (2013.01); *G02B 6/0036* (2013.01); *Y02E 10/52* (2013.01)

(58) Field of Classification Search
USPC .......................................................... 385/33
See application file for complete search history.

(56) References Cited

U.S. PATENT DOCUMENTS

| | | |
|---|---|---|
| 6,792,213 B1 | 9/2004 | Okada et al. |
| 7,817,885 B1 | 10/2010 | Moore et al. |
| 2008/0190413 A1 | 8/2008 | Grochola |
| 2009/0067784 A1* | 3/2009 | Ghosh et al. ............... 385/33 |
| 2009/0133686 A1 | 5/2009 | Charlton et al. |
| 2010/0108124 A1 | 5/2010 | Knox et al. |
| 2010/0224231 A1 | 9/2010 | Hoke |
| 2010/0278480 A1* | 11/2010 | Vasylyev .................. 385/33 |
| 2011/0162713 A1 | 7/2011 | Morgan |
| 2011/0203662 A1 | 8/2011 | Minano et al. |

(Continued)

FOREIGN PATENT DOCUMENTS

| | | |
|---|---|---|
| CA | 1219784 | 3/1987 |
| CA | 2685103 A1 | 11/2008 |

(Continued)

OTHER PUBLICATIONS

CN First Office Action dated Apr. 1, 2013 in CN Application No. 200980161082.5, Includes English Translation. 14 pages.

(Continued)

*Primary Examiner* — Eric Wong
(74) *Attorney, Agent, or Firm* — William Greener; Bond, Schoeneck & King, PLLC

(57) ABSTRACT

A light guide apparatus includes a light guide layer and an injection layer further including light injection elements and respective light bypass elements disposed optically upstream of the light injection elements. The light injection elements and/or the bypass elements may take the form of air prisms. There is an axial index of refraction variation between the light guide layer and the injection layer. The axial index of refraction variation may be discrete or may be an axial gradient index variation.

16 Claims, 38 Drawing Sheets

(56) References Cited

U.S. PATENT DOCUMENTS

| 2012/0118381 A1* | 5/2012 | Debije et al. ............... 136/259 |
| 2012/0262769 A1* | 10/2012 | Kurtz ............................ 359/15 |
| 2013/0242597 A1* | 9/2013 | Fine et al. .................... 362/555 |

FOREIGN PATENT DOCUMENTS

| JP | 2000-147262 A | 5/2000 |
| JP | 2007-027150 A | 2/2007 |
| WO | WO-2004-114418 A1 | 12/2004 |
| WO | WO-2009-035986 A2 | 3/2009 |
| WO | WO-2009-063416 A2 | 5/2009 |
| WO | WO-2009-064701 A1 | 5/2009 |

OTHER PUBLICATIONS

CN Office Action dated Feb. 8, 2013 re CN Application No. 200980161104.8, Includes an English Translation. 10 pages.

EP Communication (Third Party Observations) dated Jul. 8, 2012 in EP Application No. 09846628.8. 5 pages.

JP Office Action (Notice of Rejection) dated Jun. 4, 2013 in JP Application No. 2012-517461, Includes an English Translation. 4 pages.

Extended European Search Report dated Aug. 12, 2014, in EP Application No. 09846627.9 (7 pages).

JP First Office Action (Notice of Rejection) dated Sep. 3, 2013 in JP Application No. 2012-517462, no translation (4 pages).

* cited by examiner

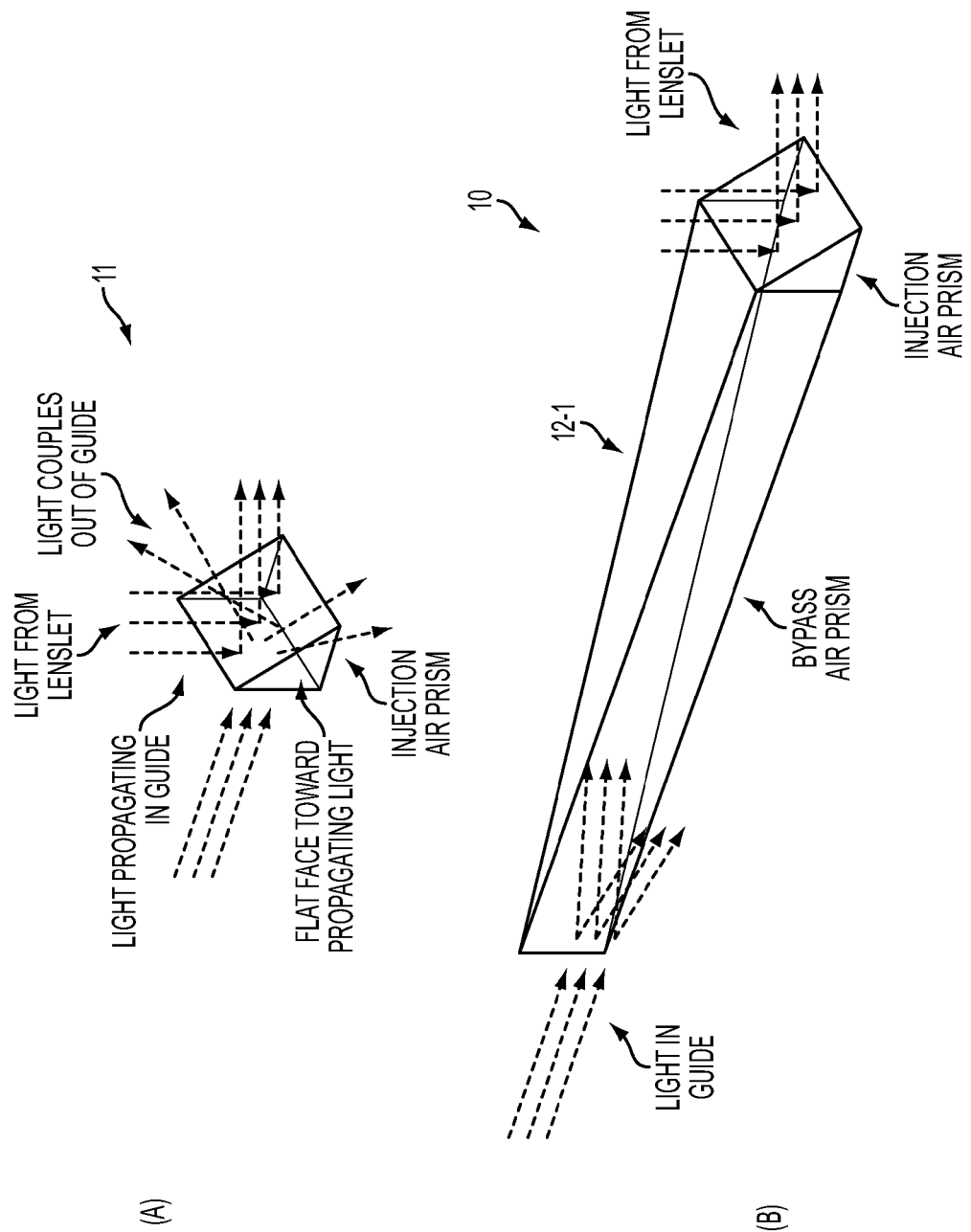

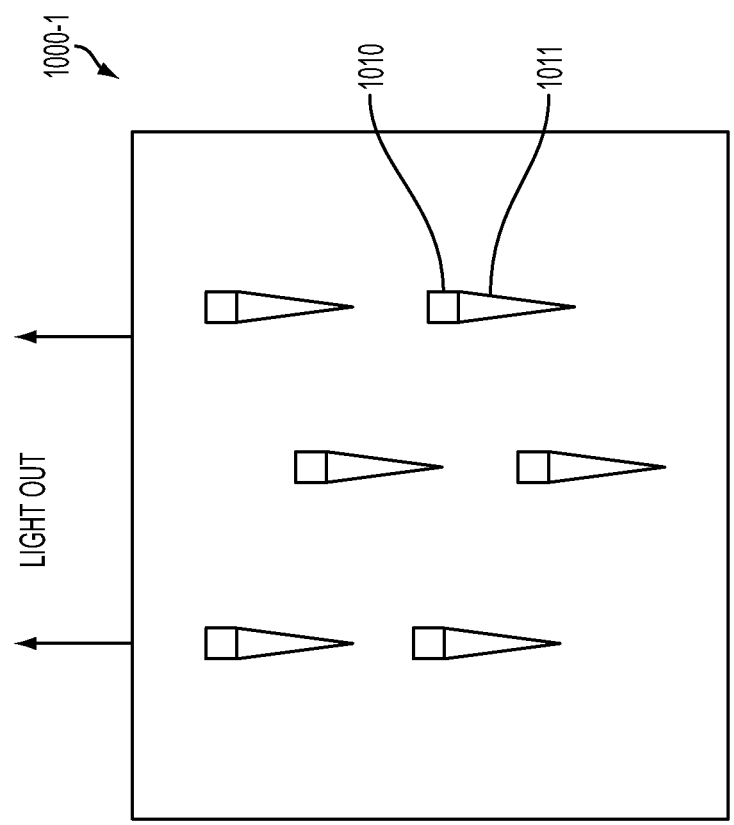

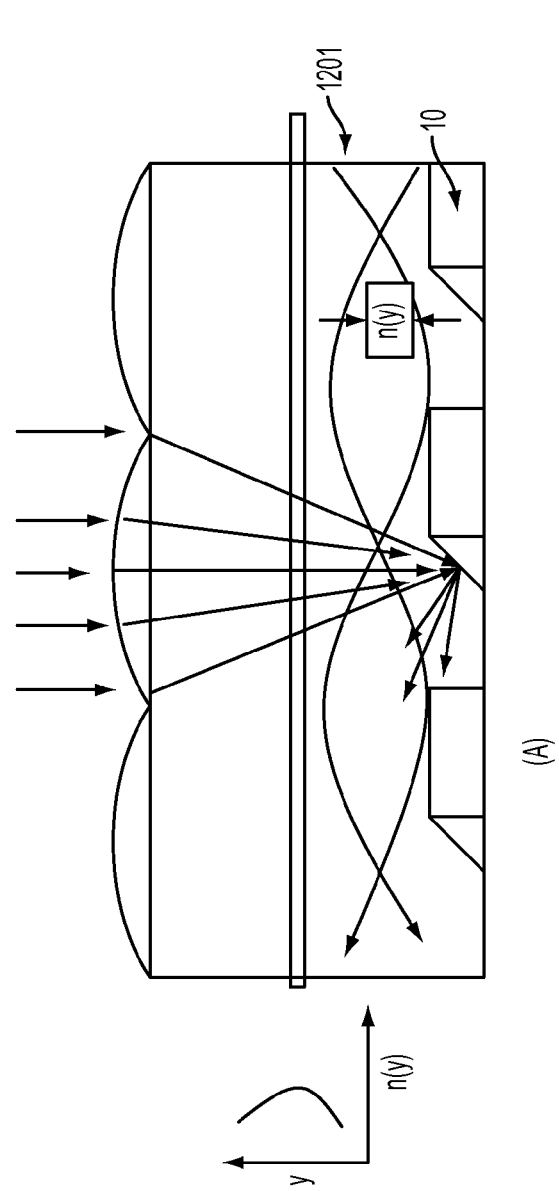
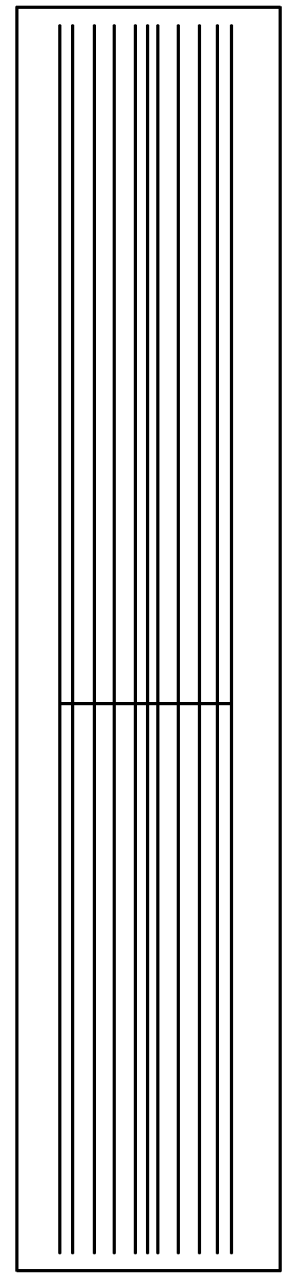
FIG. 14

1

LIGHT COLLECTING AND EMITTING APPARATUS, METHOD, AND APPLICATIONS

CROSS-REFERENCE TO RELATED APPLICATIONS

This application is a continuation-in-part application of U.S. Ser. No. 13/108,225 filed on May 16, 2011, and a continuation-in-part application of U.S. Ser. No. 12/490,417 filed on Jun. 24, 2009, the subject matters of which are incorporated by reference herein in their entireties, and claims priority to both.

GOVERNMENT SPONSORSHIP

This invention was made with government support under DARPA-MGRIN Phase 1 Agreement No. HR0011-10C-0111. The government has certain rights in the invention.

BACKGROUND OF THE INVENTION

1. Field of the Invention

Embodiments of the invention relate generally to the field of optical light guides and, more particularly, to non-imaging, light collecting and emitting apparatus, methods, and applications. Even more particularly, embodiments of the invention relate to a light collection and light guide apparatus for use in a concentrated photovoltaic (CPV) solar energy system, and other applications.

2. Related Art

Solar energy is an important part of the renewable energy solution. Concentrated photovoltaics (CPV) have the potential to provide a source of cost effective and clean energy. By concentrating solar energy with optics, less photovoltaic (PV) material is used, reducing cost, since PVs are expensive and energy-intensive to produce compared with optical components.

Co-owned U.S. Pat. No. 7,817,885 entitled LIGHT COLLECTION AND CONCENTRATION SYSTEM, the subject matter of which is incorporated by reference herein in its entirety, discloses a CPV system that incorporates a component light guide apparatus. The light guide apparatus includes a plurality of light directing structures 1102, 1104 (also referred to as 'light injection elements,' or air-prisms), shown by non-limiting, illustrative example in FIG. 1. FIG. 2 illustrates a planar light guide system as described in the related art in relation to a standard reference coordinate system. Incident light 1 from a distant, extended source (e.g., solar radiation) propagating generally in the (−)y (axial) direction is concentrated (e.g., light 2) by a lens 3 and injected into the light guide 4 via a light injection element 5 on or in the face of the guide. The light thereafter propagates generally in the z-direction (light-guiding direction) towards an exit end 6 of the light guide. The discrete light injection element 5 is a surface portion of the light guide apparatus that may be made by a partial transverse lateral cut extending from a region of the bottom surface 7 of the light guide. Depending upon the tilt angle of the light injection element, the index of refraction of the light guide, and the index of refraction of the external interface of the injection surface, radiation may be totally internally reflected from the face of the light injection element.

Alternatively or in addition, a similar light injection element 1102 can exist as a surface of the light guide apparatus made by a partial transverse lateral cut extending from a region of top surface portion 1021 (see FIG. 1). For light injection element 1102, radiation 1132 from a primary concentrator (not shown) optically coupled to light injection element 1102 is intercepted by the light injection element. Shaded area 1103 represents a reflective coating on surface 1102 that reflects the incident light 1132 into the structure for subsequent TIR propagation within the light guide apparatus (in the z-direction) towards and out the exit-end 1150. The exact angular orientations of the light injection elements will depend upon the nature of the reflection process (e.g., reflective (direct or TIR), refractive, diffractive), primary lens f/#, and the transport structure index of refraction $n_2$. The notched region behind the light injection element 1104 may, for example, be filled with a lower index dielectric material to facilitate TIR into the light transport structure.

Typical dimensions of the light injection elements are 130 μm-140 μm for the tilted reflecting surface, a base dimension of about 130 μm, and a height dimension of about 140 μm. Depending upon the length (z-direction) and width (x-direction) of the transport structure, there will be many light injection elements (1102, 1104, both), which necessarily exist in the transport structure.

In CPV applications, a general object of the system is to collect as much solar radiation as possible and concentrate that radiation as much as possible for input to a PV cell located at an output end of the apparatus. The presence of the light injection elements results in a non-ideal light guide since light propagation through the transport structure is hindered by interactions with downstream light injection elements. Light loss can occur by absorption or scattering at a light injection element, out-coupling of light at a light injection element, or étendue dilution from interaction with a light injection element. Further system objectives include maximizing primary concentrator acceptance angle, maximizing injection concentration, maximizing light guide concentration, and minimizing component and system weights and thicknesses.

The design of the light guide apparatus in the '885 patent may be considered a homogeneous design; i.e., the medium of the light guide layer and the injection facet layer are the same and thus have matching refractive indices. Light propagating with the greatest angle relative to the guiding axis will interact with the air prisms or dimples (see below) most frequently, and thus couple out of the guide more rapidly. This limits the light concentration that can be achieved in a homogenous system.

The inventors have recognized the benefits and advantages of a light collecting apparatus for use in a CPV system that is more efficient, lower in cost, higher performing, and easier to manufacture than previous apparatus, and an apparatus that can collect and emit light for lighting applications. The inventors have recognized the further benefits and advantages of a light guide apparatus in which those rays propagating with a high angle can be redirected to travel down the guide at a lower angle relative to the guiding axis for more efficient collection, propagation, emission, and overall system operation. This further would allow light to be contained in the guide for a longer propagation distance and thus increases the concentration that these systems can achieve.

SUMMARY

An embodiment of the invention is a light guide component. The light guide component includes a light guide layer having a top surface and a bottom surface, at least one of which is a substantially planar surface, and a transversely oriented side-end (exit) surface that forms an output aperture of the guide layer. The guide layer has an index of refraction, $n_1$, that is greater than an index of refraction, $n_{med}$, of a medium layer in contact with at least a portion of the top and/or bottom surface to promote light propagation by total internal reflection (TIR) within (i.e., down the length of) the light guide. As such, the light guide may include a light-transmitting medium layer disposed immediately adjacent at least one of the top and bottom surfaces of the light guide. As illustrated with reference to the related art system in FIG. 2, the guide layer 4 has a length dimension along the z-axis; i.e., in an intended light propagation direction towards the output aperture. The guide layer includes a plurality of light injection elements disposed in the top and/or bottom surface and/or in some cases between the top and bottom surfaces. The guide layer further includes a respective plurality of bypass elements disposed optically upstream of each injection element whenever an injection element would interfere with light propagation through the light guide. In an aspect described in greater detail below, the bypass element may advantageously be in the form of an 'air prism' formed by a shaped absence of guide layer material immediately behind the injection facet (also an 'air prism').

According to an aspect, each of the injection elements is a facet formed by a transverse cut into the surface of the guide layer and which extends inwardly from the surface at an angle thereto. The space behind each facet may be air (in which case the injection facet is referred to as an 'air prism') or a different material medium having a lower index of refraction than that of the guide layer into which the facet is formed. This aspect of the injection element is the same as that disclosed in application Ser. No. 12/389,466, id.

In another aspect of the invention, the guide layer includes a plurality of substantially flat diffractive elements (e.g., diffraction gratings) disposed in the plane of the top and/or bottom surface(s) and/or in a flat, non-tilted orientation within the guide layer between the top and bottom surfaces. In this aspect, bypass elements may not be included in the guide layer.

In another aspect of the invention, the guide layer includes light injection and/or bypass elements in the form of volume diffraction elements (e.g., volume holograms). The volume diffraction elements will be disposed in the planar top and/or bottom surface(s) and/or in the guide layer between the top and bottom surfaces. Alternatively or in combination therewith, a respective plurality of bypass elements in the form of volume diffraction elements may be disposed in the guide layer optically upstream from each respective injection element, where the injection elements need not be limited to diffraction elements but may also include the surface cut type injection elements mentioned above.

In other aspects, a lateral or transverse (as opposes to axial) gradient index (GRIN) in the guide layer may be used both as a dimple (bypass+injection element) or solely as a bypass structure and technique. GRIN bypass structure may be especially advantageous when used in conjunction with the air prism type injections elements mentioned above. In various aspects, linear or parabolic gradients may be established in different directions and orientations in the guide layer.

The combination of a light injection element and a bypass element of any type or form described herein will be referred to herein as a "dimple". A light guide including a guide layer with one or more dimples will be referred to herein as a "dimpled light guide". Dimpled light guides are a form of non-imaging light concentrator that allow for improved light concentration in a thin and lightweight form factor.

According to non-limiting aspects, the top and/or bottom surfaces of the light guide component may have a flat, a staircase, a saw-tooth, an echelon (slanted-staircase), curved, or otherwise shaped top or bottom surface. According to further alternative aspects, the light injection elements may be disposed in the interior of the transport structure in the form of prisms, gratings, quantum dots, photonic crystals, and other structures that would be able to provide the required function of the light injecting elements with or without a primary concentrator.

Another and related embodiment of the invention is directed to a light collection and concentration system. The system includes a primary light concentrator component coupled to a single light guide such as described in the various aspects hereinabove. The system may advantageously include a secondary light concentrator associated with the single light guide. The system may also further include a PV cell disposed adjacent the light output aperture. In various, non-limiting, alternative aspects, the primary light concentrator component may be any of a variety of known elements that can collect incident solar radiation and concentrate this incident radiation into a smaller area (i.e., onto an injection element). Refractive elements (e.g., lenses), reflective elements (e.g., mirrors), and diffractive elements (e.g., gratings, holograms) are non-limiting examples of primary light concentrators that may be used. According to various non-limiting aspects, a single primary light concentrator element of the primary component may take the form of a conventional focusing lens, a Fresnel lens, a cylindrical lens, a parabolic mirror (or segment thereof), an angle-angle concentrator, and other optics known in the art. In an advantageous aspect, the primary light concentrator component is a refractive lens array in an alternating tiled configuration. Each component optical element of the primary concentrator is associated with a respective light injection element in the light guide.

Since it is intended that primary light propagation in the guide layer be by TIR, at least either the top or bottom surface of the guide layer will be bounded by a medium having an index of refraction that is lower than the index of the guide layer material (a TIR layer). The location of the lower index medium immediately adjacent the top and/or bottom surface of the guide layer may depend on whether the light injection elements are in the top or bottom surface of the guide layer. Various one-sided and two-sided light guides will be described in detail below.

The aforementioned light collection and concentration system provides a means by which light that is for the most part normally incident (i.e., within an allowable acceptance angle) on the primary concentrator component, and concentrated by the primary concentrator component, is input to and/or directed in a different, desired propagation direction in the light guide towards the output aperture of the transport structure. Thus the light injection elements suitably function to capture the primary-concentrated light spot that is for the most part normally incident on the system and redirect it, illustratively, at 90 degrees, in order for it to propagate along the length (z-direction) of the light guide towards the exit-end thereof.

The light guide layer discussed above is in the form of a thin sheet waveguide; i.e., having a thickness, T, much less than the general length, L, of the structure and thus having a low aspect ratio defined by T/L. An optional secondary light concentrator may be provided in the light guide and system embodiments disclosed herein, which serves to collect the light propagating in the low-aspect-ratio guide layer and further concentrate it for out-coupling through the exit-end of the guide layer and, advantageously, into a PV cell disposed to directly receive the out-coupled light. According to a non-limiting aspect, a secondary light concentrating optical component may be operatively coupled to (e.g., molded to, cemented to, free-space-aligned to, etc.) the exit-end of the light guide to secondarily concentrate and out-couple the light into the PV cell. The secondary concentrator may be made of the same or a different material than the guide layer. Alternatively, the exit-end itself of the guide layer may be shaped (e.g., parabolically-tapered; straight-tapered; trapezoidally-tapered; or, otherwise appropriately shaped) to integrally form the secondary concentrator in the exit-end of the guide layer. Such shapes will support all types of reflection (TIR and/or specular reflection and/or diffuse reflection) of the light propagating in the light guide.

An embodiment of the invention is a light guide apparatus. The light guide apparatus includes a light guide layer having a top surface and a bottom surface, at least one of which is a substantially planar surface, and a transversely oriented side-end surface that forms an output aperture of the light guide, characterized by an index of refraction, $n_1$, and further characterized by a length dimension in an intended light propagation direction towards the output aperture, where the intended light propagation direction is a z-axis direction of a Cartesian coordinate system; and a plurality of light injection elements disposed in the form of at least one linear strip in at least one of the top and bottom surfaces of the light guide layer, wherein some of the plurality of light injection elements are disposed on one lateral side of the strip and some other of the plurality of light injection elements are disposed on an opposing lateral side of the strip, further wherein each light injection element is disposed outwardly at a rotation angle $\Delta z$ about the y-axis. In the detailed description that follows, each of the light injection elements including a bypass element may be referred to as a 'dimple' or 'light injection facet' and the plurality of light injection elements may be referred to as the 'dimple layer' or 'injection layer' of the light guide. Each of the light injection elements ('injection facets,' with or without bypass elements) is formed by a transverse cut into the surface of the light guide layer, which extends inwardly from the surface at an angle thereto, referred to as the injection angle. The space behind each facet may be air or a material having a lower index of refraction than that of the light guide layer into which the facet is formed. According to non-limiting aspects, the light guide apparatus includes a primary light concentrator array disposed adjacent the top or bottom surface of the light guide layer. The primary light concentrator array may be comprised of any of a variety of known optical elements that can collect incident solar radiation and concentrate this incident radiation into a smaller area (i.e., onto the face of an injection element). Refractive elements (e.g., lenses), reflective elements (e.g., mirrors), and diffractive elements (e.g., gratings, holograms) are non-limiting examples of primary light concentrator elements that may be used. According to various non-limiting aspects, a single primary light concentrator element may take the form of a conventional focusing lens, a Fresnel lens, a cylindrical lens, a parabolic mirror (or segment thereof), an angle-angle concentrator, and other optics known in the art. The primary light concentrator array may be in the form of a regular, linear array, an offset, segmented, tiled, or tessellated array, or other configuration in which each single element may have a perimeter shape that may be regular or irregular. Each single element of the component array will be optically registered with a respective facet in the light guide (i.e., will focus or otherwise concentrate incident light onto the reflecting face of a respective dimple). Since light propagation in the guide layer will primarily be by TIR, at least either the top or bottom surface of the guide layer will be bounded by a TIR medium having an index of refraction $n_2$ that is lower than the index of the guide layer material. The location of the lower index TIR medium immediately adjacent the top and/or bottom surface of the guide layer may depend on whether the dimple layer is the top or bottom surface of the light guide layer. According to the embodied invention, the dimple layer may be comprised of parallel strips of dimples, wherein each strip has a linear or repeating plurality of dimples on one lateral side and on the other lateral side of the strip. The dimples on opposing sides of the strip may be in an opposite-type configuration, for example, if the primary light concentrator array is regular and aligned or, the dimples on opposing sides of the strip may be in an alternate-type configuration, for example, if the primary light concentrator array is tiled, tessellated, or offset, as will be described in greater detail below. These dimple strip configurations may figuratively be thought of as having a 'Christmas-tree' shape in which the light propagation direction in the waveguide layer is from the tip to the base of the 'Christmas tree' (i.e., the z-direction). In each of the opposite-type or alternate-type configuration aspects, the reflecting face of each dimple will be outwardly offset in the x-y plane from the z-axis by a rotation angle $\Delta z$ such that the path of incident light reflected from each dimple and propagated down the waveguide layer in the z-direction does not intersect the next downstream dimple. The embodied light guide apparatus provides a means by which light that is for the most part normally incident (i.e., within an allowable acceptance angle) on the primary concentrator array, and concentrated by the primary concentrator elements, is input to and/or directed in a different, desired propagation direction in the light guide towards the output aperture of the light guide layer. Thus the light injection elements suitably function to capture the primary-concentrated light that is for the most part normally incident on the system and redirect it, illustratively, at 90 degrees (see FIG. 1), in order for it to propagate along the length (z-direction) of the light guide towards the exit-end thereof.

The light guide layer discussed above is in the form of a thin sheet waveguide, i.e., having a thickness, T, much less than the general length, L, of the structure and thus having a low aspect ratio defined by T/L. An optional secondary light concentrator may be provided, which serves to collect the light propagating in the low-aspect-ratio guide layer and further concentrate it for out-coupling through the exit-end of the guide layer and, advantageously, into a PV cell disposed to directly receive the out-coupled light. According to a non-limiting aspect, a secondary light concentrating optical component may be operatively coupled to (e.g., molded to, cemented to, free-space-aligned to, etc.) the exit-end of the light guide to secondarily concentrate and out-couple the light into the PV cell(s). The secondary concentrator may be made of the same or a different material than the guide layer. Alternatively, the exit-end itself of the guide layer may be shaped (e.g., parabolically-tapered; straight-tapered; trapezoidally-tapered; or, otherwise appropriately shaped) to integrally form the secondary concentrator in the exit-end of the guide layer. Such shapes will support all types of reflection (TIR and/or specular reflection and/or diffuse reflection) of the light propagating in the light guide.

Another embodiment of the invention is directed to a light collecting/emitting illumination apparatus. This embodiment is structurally similar to the above described embodiment in so far as the low aspect ratio planar form, the Christmas-tree dimple structured dimple layer, and the primary light concentrator array. According to the instant embodiment, a transverse edge face (i.e., the 'output' face in the above described embodiment) would be the input face of the apparatus. TIT-guided input light will be reflected by the dimples towards the primary optical component (lens, mirror, etc.) array and output from the top or bottom surface of the apparatus to provide, for example, architectural lighting.

Another embodiment of the invention is a light guide apparatus that includes a light guide component including a light guide layer section having an index of refraction $n_1$, and an injection layer section having an index of refraction $n_2$ disposed axially (y-direction in FIG. 3) adjacent the light guide layer section, wherein $n_2$ is greater than $n_1$ by an amount $\Delta n >$ zero. In various exemplary, non-limiting aspects, the light guide apparatus may further include or be characterized as follows:

wherein $\Delta n \leq 0.5$
wherein $0.02 \leq \Delta n \leq 0.03$;
wherein $n_2 \approx n_1/\cos\theta_2$, where $\theta_2$ is the maximum angle between an edge ray of a ray bundle incident on the injection layer section and an optical propagation axis of the ray bundle incident on the injection layer section;
wherein the light guide layer section includes an axial gradient index $\Delta n_1$;
wherein the light guide layer section and the injection layer section are separate, co-joined layers consisting of a light guide layer and an injection layer;
wherein $0.02 \leq \Delta n \leq 0.03$;
wherein $n_2 \approx n_1/\cos\theta_2$, where $\theta_2$ is the maximum half-angle between an edge ray of a ray bundle incident on the injection layer and a horizontal plane of the injection layer;
wherein the light guide layer is one of a glass and a plastic that can transmit solar radiation wavelengths, and the injection layer is one of glass, plastic, or silicone that can likewise transmit solar radiation wavelengths;
wherein the injection layer includes a plurality of injection facets in a lateral-stepped configuration;
wherein the injection layer includes a plurality of injection facets and corresponding bypass elements (collectively, 'dimples') in a lateral-stepped configuration;
wherein the injection facets and corresponding bypass elements are air prisms;
wherein the light guide layer includes an axial gradient index $\Delta n_1$;
wherein $0.02 \leq \Delta n_1 \leq 0.03$;
wherein the axial gradient index $\Delta n_1$ decreases in the axial direction from at least one of a top and a bottom axial surface of the light guide layer adjacent the injection layer towards a center region of the light guide layer;
wherein the axial gradient index $\Delta n_1$ does not extend for more than about 99% of the thickness of the light guide layer;
wherein the axial gradient index $\Delta n_1$ does not extend for more than 20% of the thickness of the light guide layer;
further comprising a TIR layer having an index of refraction $n_3$, wherein $n_3$ is less than $n_1$, disposed immediately axially adjacent the light guide layer section that is not adjacent the injection layer section;
further comprising a lens array disposed adjacent the light guide component.

As referred to herein, the lateral-stepped configuration of the injection layer that is disclosed in co-owned U.S. Pat. No. 7,817,885 provides a particularly advantageous structure when combined with the embodied axial gradient light guide layer.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIGS. 4A, B illustratively show an air prism injection element and a dimple, respectively, according to an aspect of the invention as shown in FIG. 3A;

FIG. 12 is a top plan view of a dimpled light guide according to an illustrative embodiment of the invention;

FIGS. 14A, B are a side cross sectional view and a top cross sectional view, respectively, of a GRIN-based light collection and concentration system, according to an exemplary aspect of the invention;

FIG. 18 schematically shows an alternate-type configuration dimple strip of a light guide apparatus according to an exemplary aspect of the invention;

DETAILED DESCRIPTION

Figure 1:
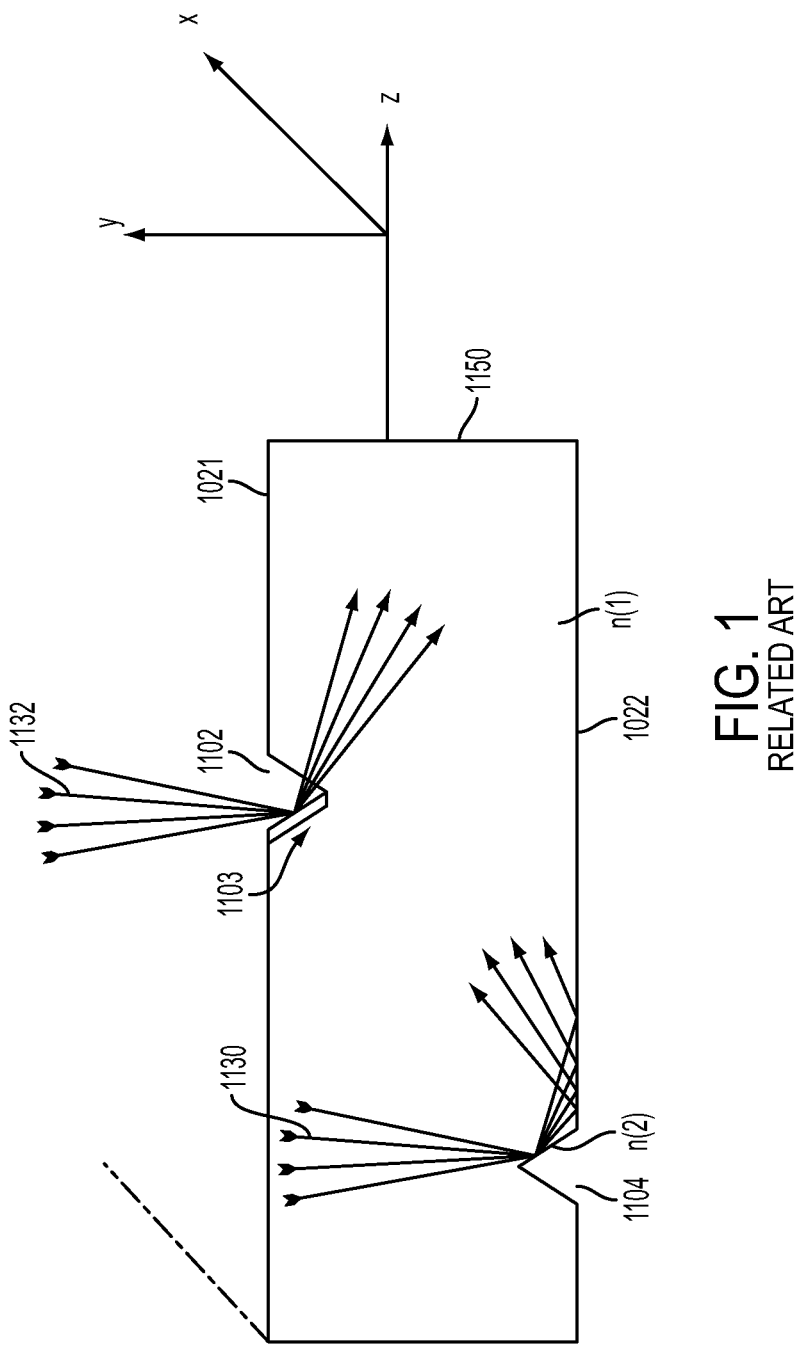
FIG. 1 schematically shows in cross section an illustrative light guide with two exemplary air prism injection facets, according to the related art.

Reference will now be made in detail to the present exemplary embodiments of the invention, examples of which are illustrated in the accompanying drawings.

A 'dimple' according to a representative aspect of the invention is shown in FIG. 3, and is designated by reference numeral 10. As used herein in accordance with a non-limiting embodiment of the invention, the term 'dimple' refers to a structural component of a planar light guide. As illustrated in FIGS. 3A and 4B, the dimple 10 is composed of two parts: a light injection element 11 and a light bypass element 12. Each injection element in the light guide is located to receive focused or near-focus light from a respective primary light concentrator element (e.g., lenslet) as described in greater detail below. In the instant aspect, the injection element acts to redirect light from a direction generally normal to the light guide (−y direction in FIG. 1) to a propagation direction in the light guide (z-direction) towards the exit window of the guide layer. The bypass element acts to redirect light propagating within the guide layer in the z-direction around downstream injection elements. Since the injection element surfaces (e.g., air prisms) that protrude into the interior of the guide layer are actually obstacles that create a non-ideal light guiding structure, they can cause light leakage by refraction or reflection at angles that no longer satisfy the TIR condition for propagation within the guide layer. The bypass element is intended to reduce this disruption, decreasing the loss and thus increasing maximum out-coupled light concentration.

Figure 3A:
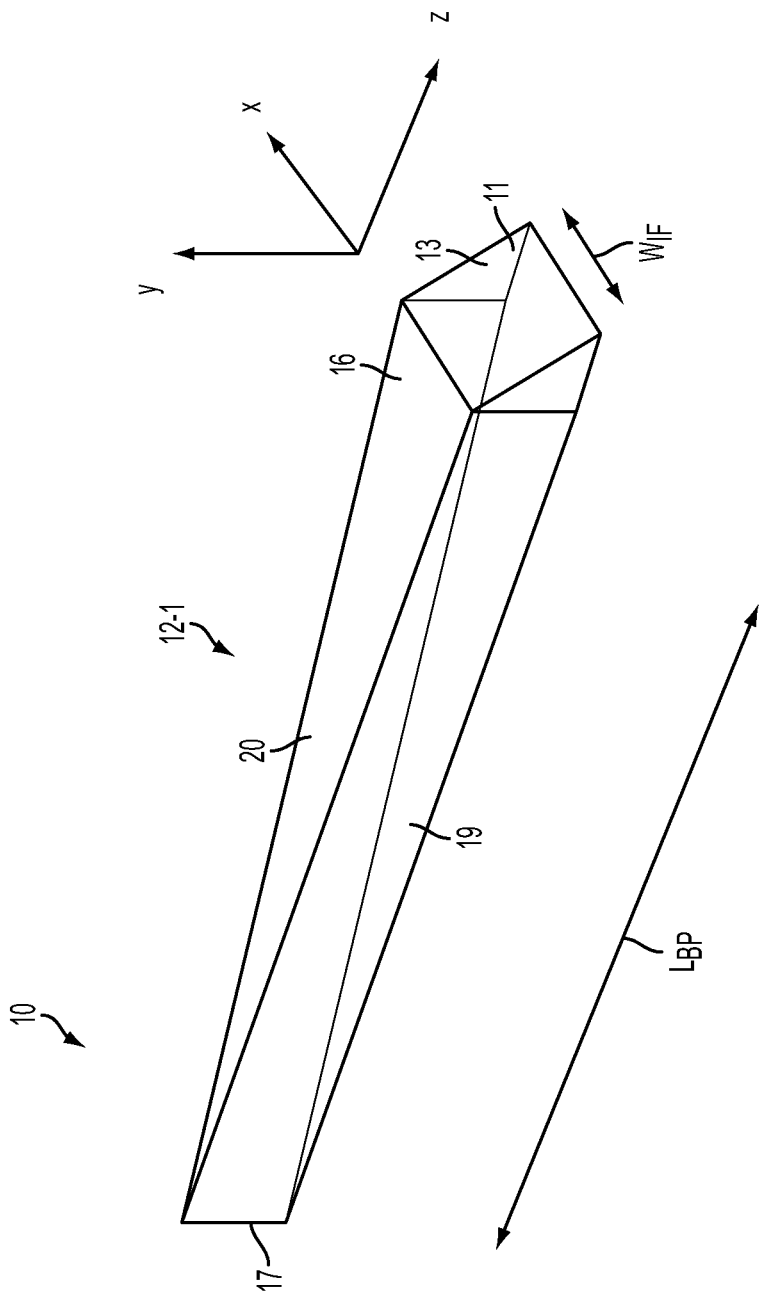
FIG. 3A shows a perspective constructional view of a multi-surface by-pass prism dimple having un-tilted reflection surfaces.

The function of the dimple is further explained by a non-limiting example of the injection and bypass elements as illustrated in FIG. 3A. The light injection element 11 (see, e.g., 1102, 1104 in FIG. 1) is an air prism whose face surface 13 is an injection facet for the light guide 1150 shown by example in FIG. 1. The bypass element 12-1 is also configured as an air prism (i.e., light guide layer material is removed immediately behind the injection facet creating the guide medium surrounded by air; or another material having an index of refraction that is less than the index of the light guide material). The head end 16 of this bypass prism is coupled to the back of the injection element opposite the injection facet 13, with its height and width (shape) constrained to be the same as the that of the back face of the injection prism. The tail end 17 of the bypass prism comes to sharp edge. The bypass prism includes two angled, un-tilted (in the y-z plane), non-tapered, material 'side' surfaces 19, 20 (which are left after removal of material there between) that totally internally reflect the light traveling in the transport layer (z-direction) due to their angular orientation and material properties, and which redirect the propagating light into the x- and/or y-directions to reduce or avoid interactions with the downstream dimples.

The injection facet orientation with respect to the light guide layer determines the initial direction of light propagation in the guide. Two parameters define this orientation: a tilt of the facet with respect to the optical axis of each lenslet and a clocking around that axis. Nominally, the injection facets are clocked to point directly down the guide to the exit face in the +z direction. This leaves one free parameter-facet tilt. Since the dimples are contained within the light guide layer, the angles of incidence between light and the facet should satisfy the TIR condition to avoid reflectivity losses inherent with reflective coatings. The constraint of TIR limits the angle at which light can be injected into the guide without loss. Specifically, the injection facets should be oriented so that all of the angles produced by the primary concentrator elements (hereinafter, lenslets') satisfy TIR, given by:

$$\theta_{critical} = \arcsin[n_{air}/n_{LG}], \text{ and } \theta_{critical} \geq \theta_{facet} + \arcsin[N.A._{z\text{-}lenslet}/n_{LG}] \quad (1)$$

Each lenslet's numerical aperture ($NA_z$) should be small, since the TIR condition for optical glass is close to 45°. In the direction orthogonal to both incoming and reflected light propagation, $NA_x$ is not constrained, since all angles will satisfy the TIR condition if $NA_z$ satisfies TIR. In an aspect, therefore, lenslet apertures will be rectangular (discussed further below), but may also be circular, hexagonal, or other geometric, close-packed, and non-close-packed shapes.

Figure 2:
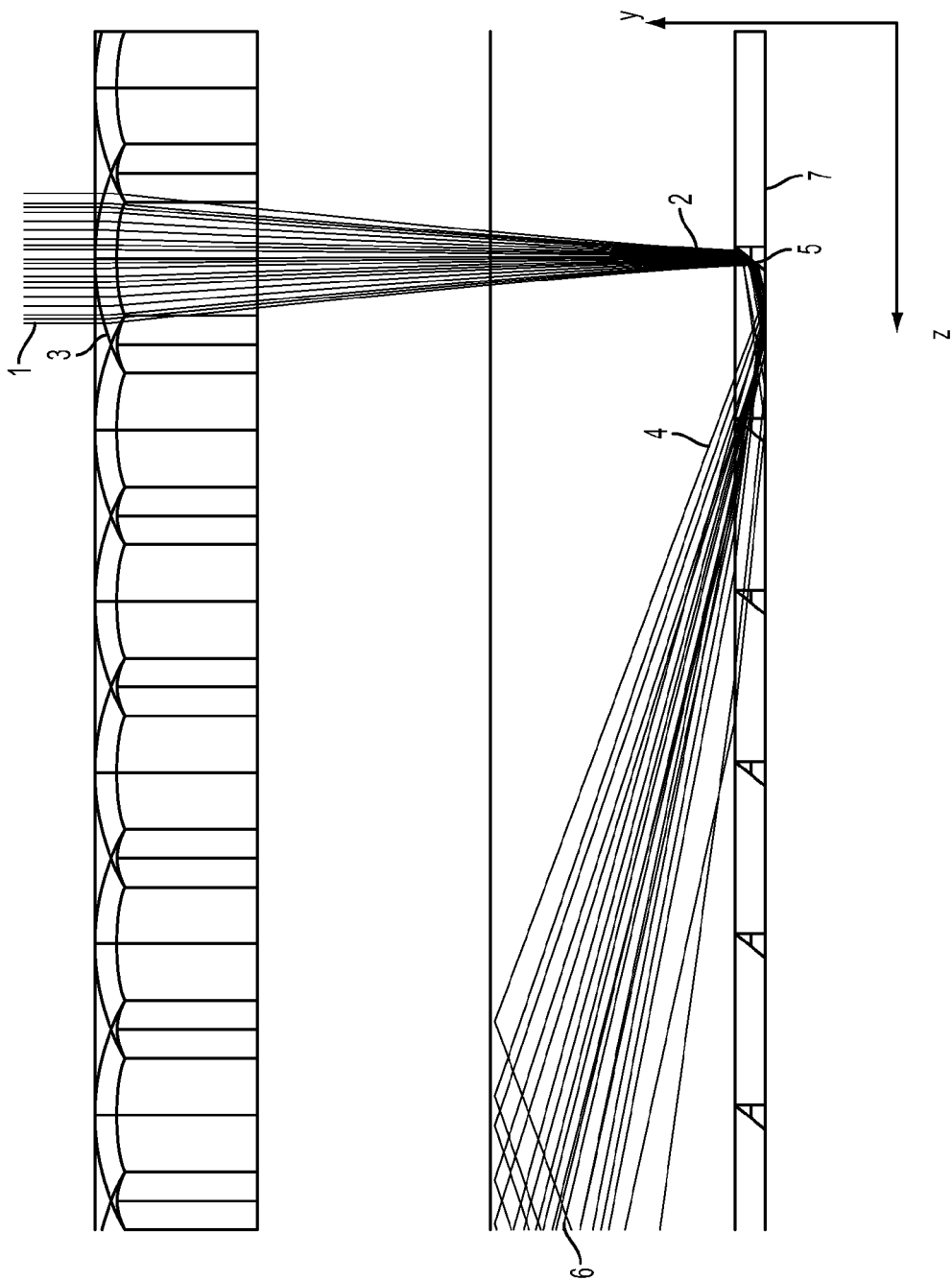
FIG. 2 schematically shows in cross section an illustrative planar light guide solar collection and concentration system with coordinate system, according to the related art.
Figure 3B:
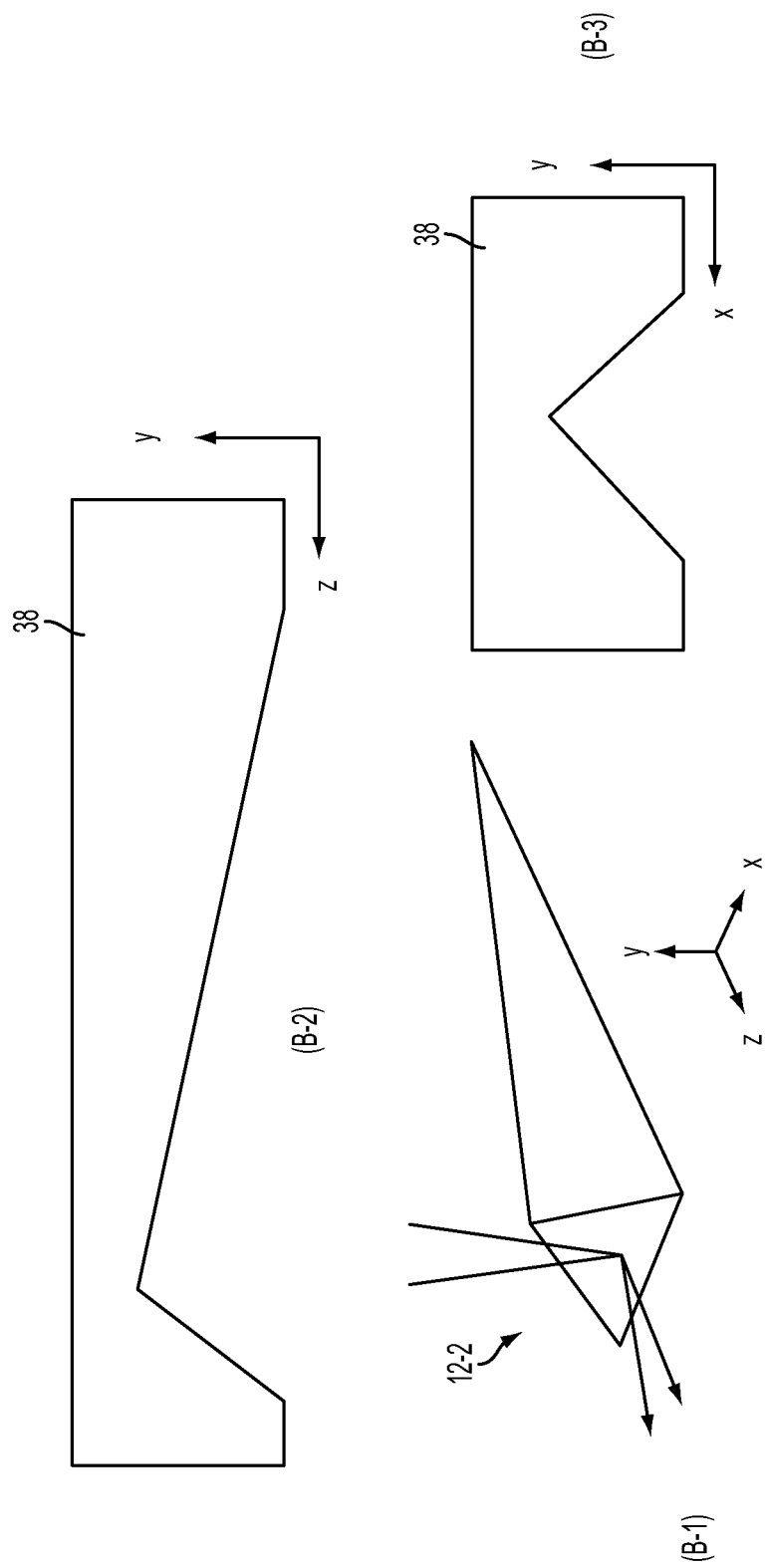
FIG. 3B illustrates a multi-surface by-pass prism dimple having tilted reflection surfaces.
Figure 3C:
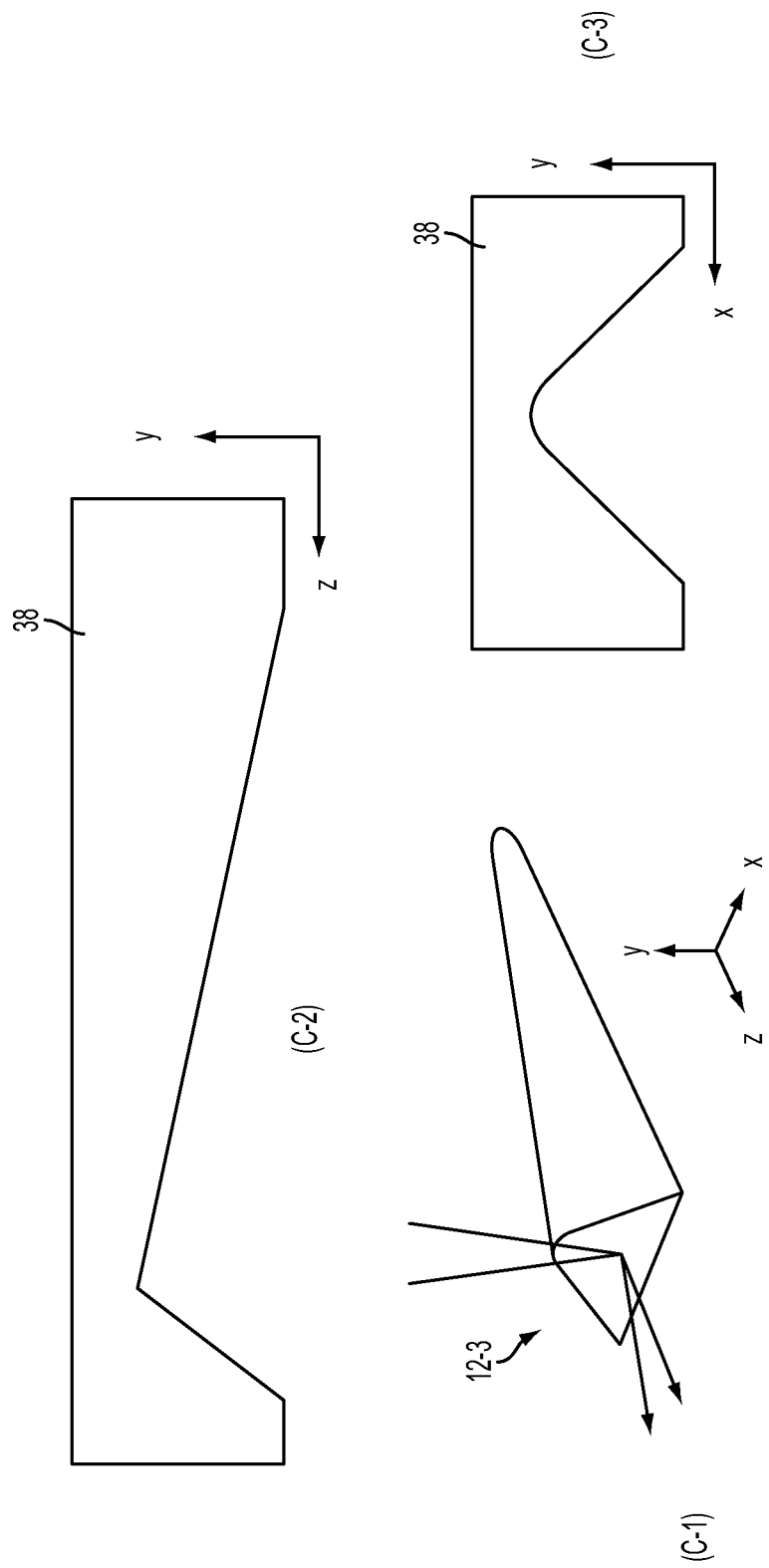
FIG. 3C illustrates a multi-surface by-pass prism dimple having tilted reflection surfaces whose edges have a fillet radius; and, FIG. 3D illustrates a one-sided by-pass prism dimple having a conical surface, according to alternative, illustrative aspects of the invention.
Figure 3D:
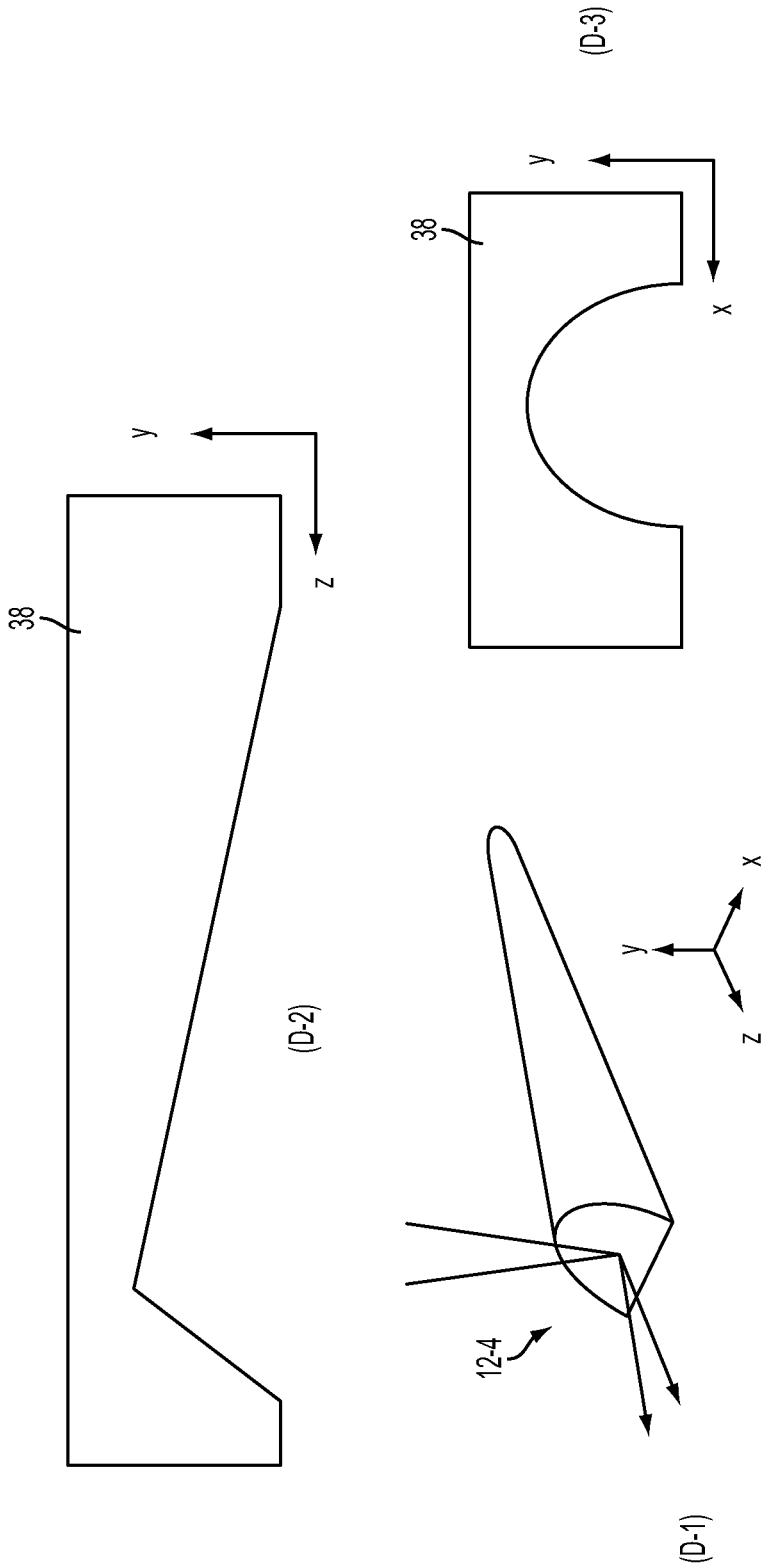

The second part of the dimple, according to the present embodiment, is the by-pass prism, which is coupled to the back of the injection facet. Its purpose is to reduce light leakage from the guide layer by redirecting light around the injection prism. Instead of a direct loss, the bypass prism increases the angular distribution of light in the guide layer. The bypass prism redirects light into the x-z- and/or y-z-dimensions of the guide layer. The cross-section of the bypass prism may be a rectangle with the x-dimension growing smaller towards the apex (rear) of the prism, as shown in FIG. 3A. Other cross sectional shapes may be advantageous depending on the prescribed concentration ratio, guide length, and guide height. The bypass prism may have a cross section that decreases in size in both x- and y-dimensions from front to rear, so that the apex of the bypass prism comes to a point; or, the bypass prism may have a cross-section taper in the y-dimension only. Alternatively, the cross-section may be circular, elliptical, or otherwise geometrically shaped. For example, FIG. 3B-1 illustrates a by-pass prism 12-2 having a triangular cross section that tapers in the y-direction from front to rear. FIGS. 3B-2 and 3B-3 show side-cross sectional and end-cross sectional profile views, respectively, of the by-pass prism in the light transport structure according to an aspect. In another aspect as shown in FIG. 3C-1, the by-pass prism has a semi-triangular cross section similar to that of by-pass prism 12-2, only the top and end edges have a fillet radius that may make for an easier manufacturing process. FIGS. 3C-2 and 3C-3 show side-cross sectional and end-cross sectional profile views, respectively, of the by-pass prism in the light transport structure. In an alternative aspect, a tapered, one-sided, conical cross section by-pass prism 12-4 is illustrated in FIG. 3D-1. FIGS. 3D-2 and 3D-3 show side-cross sectional and end-cross sectional profile views, respectively, of the by-pass prism in the light transport structure.

From simple geometry, two dimensions determine the wedge angle $2\theta_{BP}$ of a two-sided bypass prism as shown in FIG. 3A: the width $W_{IF}$ of the injection facet and the length $L_{BP}$ of the bypass prism, where:

$$\theta_{BP} = \tan[W_{IF}/2L_{BP}]. \quad (2)$$

If the incidence angle of incoming light is less than the critical angle of the guide with respect to $\theta_{BP}$, the bypass prism will add $2\theta_{BP}$ to the x-direction cosine. If the incident light is beyond the critical angle, light will refract through the bypass prism and be lost from the guide layer. Since the dimples make up only a small part of the cross-sectional area of the light guide, only a small percentage of light interacts with any given dimple. This interaction probability depends on the relative size and spacing of the dimples and the incidence angle of light on the dimples. Light with a larger x-component will experience a larger dimple cross-section because the bypass prisms are long and thin.

FIG. 12 is a top plan view of a dimpled light guide 1000-1 according to an illustrative, exemplary embodiment. The black squares 1010 represent air prism injection facets extending upward and tilted from the bottom surface of the guide layer. The bypass prisms 1011 are shown extending rearwardly from each of the injection elements.

According to the various aspects of the invention, the light injection elements are not necessarily limited to air prisms as discussed hereinabove. According to an aspect, a diffraction grating or diffractive element can be used either in transmission or reflection to inject light into the guide layer. The general path of the light will be similar to that of the TIR/reflective air prism injection facet, however, the diffractive element is disposed in a plane parallel to the guide layer surfaces; i.e., either on the top or bottom surface or between the surfaces. Incident light will be concentrated by a primary focusing element to a small spot and onto the diffractive element. The diffractive element diverts the incident beam of light into angles that can propagate within the guide layer, typically less than 50° from parallel with respect to the guide. The diffractive elements have an insubstantial vertical extent, thus the obstruction by diffractive elements to light propagating in the guide will be less than the corresponding air prism injection elements. Also, light propagating in the guide layer that encounters a diffractive element will be diffracted into multiple orders and may still be contained within the guide layer.

In regard to the grating structure, the period of the diffraction grating must satisfy $\theta_m \geq \theta_{critical}$, where $\theta_m$ is the diffracted angle into the mth order, and $\theta_{critical}$ is the maximum angle of light supported by the guide layer;

$$\theta_m = \sin^{-1}\left[\frac{n_{guide}(m\lambda + \sin\theta_i)}{d}\right],$$

$$\theta_{critical} = \sin^{-1}\left[\left(\frac{n_{bounding}}{n_{guide}}\right)\sin\theta_i\right]$$

where $n_{guide}$ is the index of refraction of the guide layer, $\lambda$ is the wavelength, $\theta_i$ is the incident angle of light with respect to the surface normal, d is the grating period, and $n_{bounding}$ is the index of the bounding media of the guide. This condition must be satisfied for all diffracted orders of interest, which will advantageously be one or two dominant orders. The spacing of the repeated structure will determine the angles of diffraction and will apply regardless of the specific structure of the grating. The specific structure may be optimized to maximize the energy diffracted into one or two orders of interest.

Figure 7:
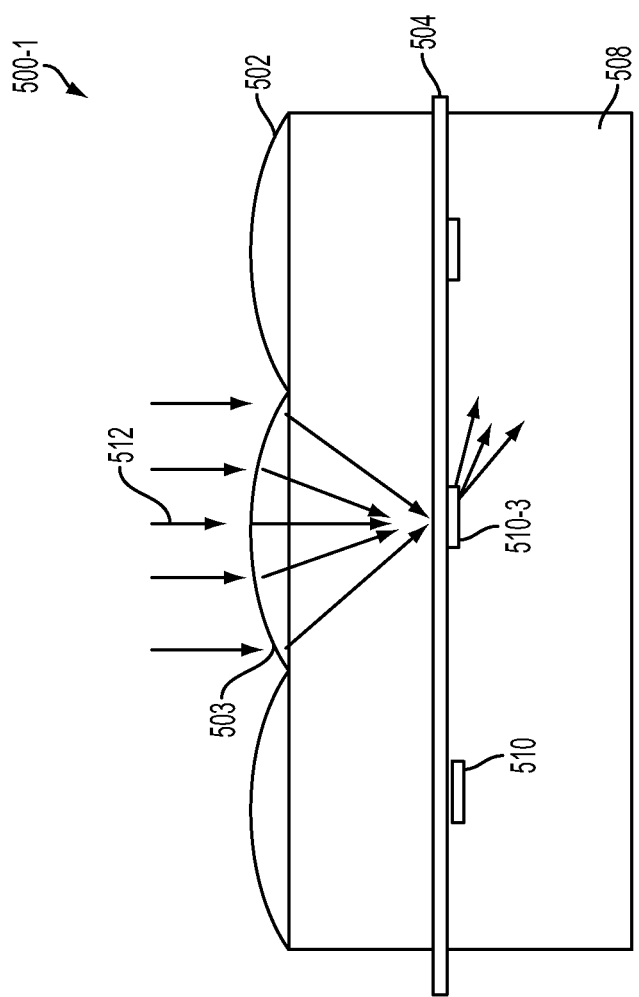
FIG. 7 schematically shows in cross section a light collection and concentration system including a light guide having diffraction-based light injection elements, according to an exemplary aspect of the invention.

FIG. 7 schematically illustrates in cross section a light collection system 500-1 that includes a primary concentrator in the form of a refractive lenslet array 502, a lower index TIR medium layer 504, and a guide layer 508 including transmission diffraction gratings 510 disposed in the upper surface of the guide layer. Incident light 512 is concentrated (e.g., focused or not) by a lenslet element 503 onto a respective diffraction grating 510-3. The grating can be designed to diffract one or two dominant transmitted orders into the guide layer as shown by the arrows therein.

Figure 8:
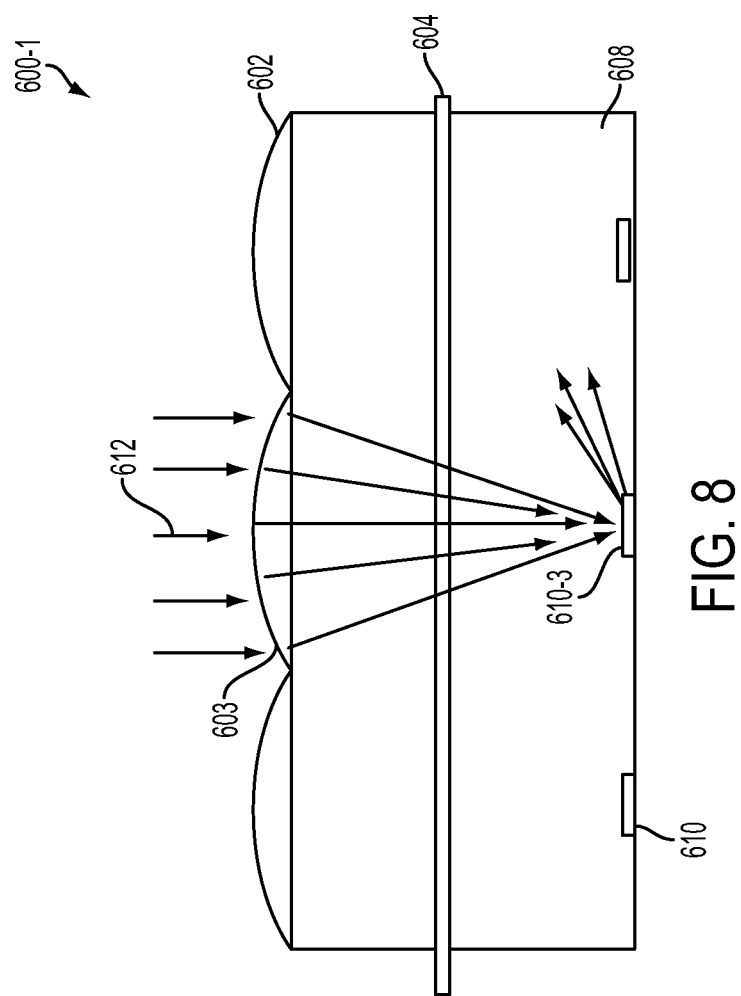
FIG. 8 schematically shows in cross section a light collection and concentration system including a light guide having diffraction-based light injection elements, according to another exemplary aspect of the invention.

FIG. 8 similarly schematically illustrates in cross section a light collection system 600-1 that includes a primary concentrator in the form of a refractive lenslet array 602, a lower index TIR medium layer 604, and a guide layer 608 including reflection diffraction gratings 610 disposed in the bottom surface of the guide layer. Incident light 612 is concentrated (e.g., focused or not) by a lenslet element 603 onto a respective diffraction grating 610-3 whereupon the light diffracts into one or two dominant reflected orders into the guide layer as shown by the arrows therein. This arrangement allows for a shallower groove depth than in the transmission case above, since the delta-n and hence path difference between adjacent groove features is much greater.

Figure 9:
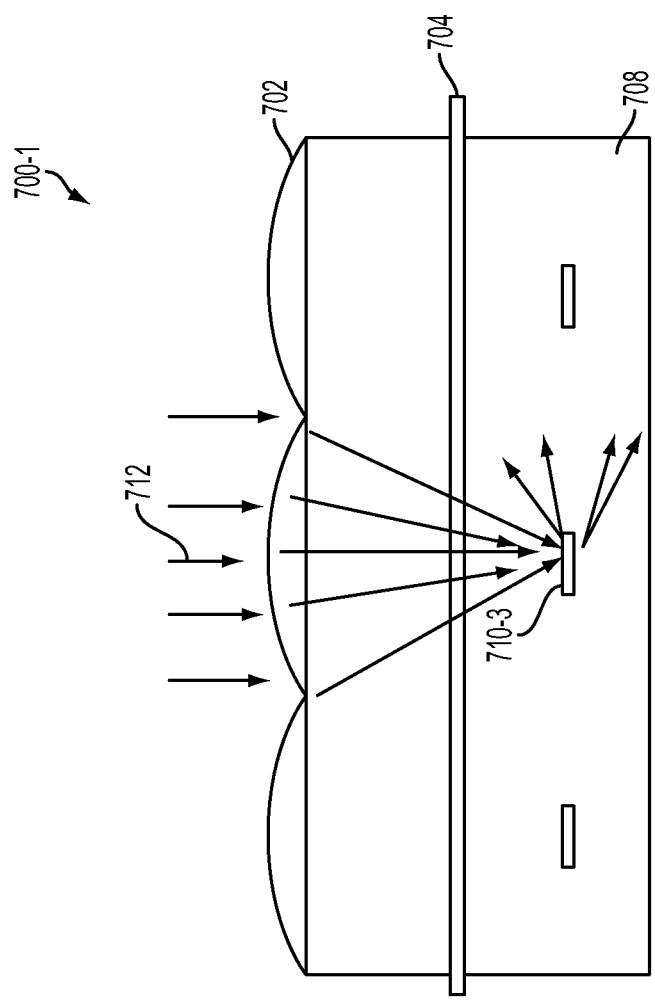
FIG. 9 schematically shows in cross section a light collection and concentration system including a light guide having diffraction-based light injection elements, according to another exemplary aspect of the invention.

FIG. 9 similarly schematically illustrates in cross section a light collection system 700-1 that includes a primary concentrator in the form of a refractive lenslet array 702, a lower index TIR medium layer 704, and a guide layer 708 including a transmission grating 710-3 located intermediate the top and bottom surfaces of the guide layer. Incident light 712 is concentrated onto the grating whereupon both reflected and transmitted orders are diffracted into the guide layer.
In order to locate the diffraction gratings between the top and bottom surfaces of the guide layer, two pieces of material, which together would make up the guide layer may advantageously be glued or cemented together. In an exemplary aspect, the diffractive element is applied to one surface of a plastic or glass guide layer that is ~½ the thickness of the final guide. An adhesive layer is applied on top of this, and another piece of plastic or glass is glued in place. The diffractive element may be written into a polymer-on-glass, silicone-on-glass, or into the plastic or glass directly. The central adhesive layer should be relatively closely index matched to the guiding layer, but it is not a necessity as long as the central layer has an index higher than the low-index TIR layer. According to another exemplary aspect, a laser-writer could be focused at some intermediate point within a continuous guide layer material. The laser would alter the state of the material, either by heating or polymerization as known in the art to make volume holograms, for example.

According to another aspect of the invention, a non-axial gradient index of refraction (GRIN) can be provided in the guide layer to act as both a dimple (injection element+bypass element) or merely as a bypass for a different type of injection element, e.g., air prism.

In a first illustrative example discussed with reference to FIGS. 14A, B, a linear or parabolic gradient 1201 in the y-direction may be used to maintain the majority of the propagating light away from the surface-located injection elements or generally in the center region of the guide layer, respectively. The gradient profile in this case would be uniform across the x-z plane as shown in FIG. 14B. Such a gradient would take the form $$n(y)=N_o+N_{o1}y+N_{o2}y^2,$$

where $N_o$ is the base index of refraction, $N_{o1}$ is the linear gradient coefficient, and $N_{o2}$ is the parabolic gradient coefficient.

Figure 15:
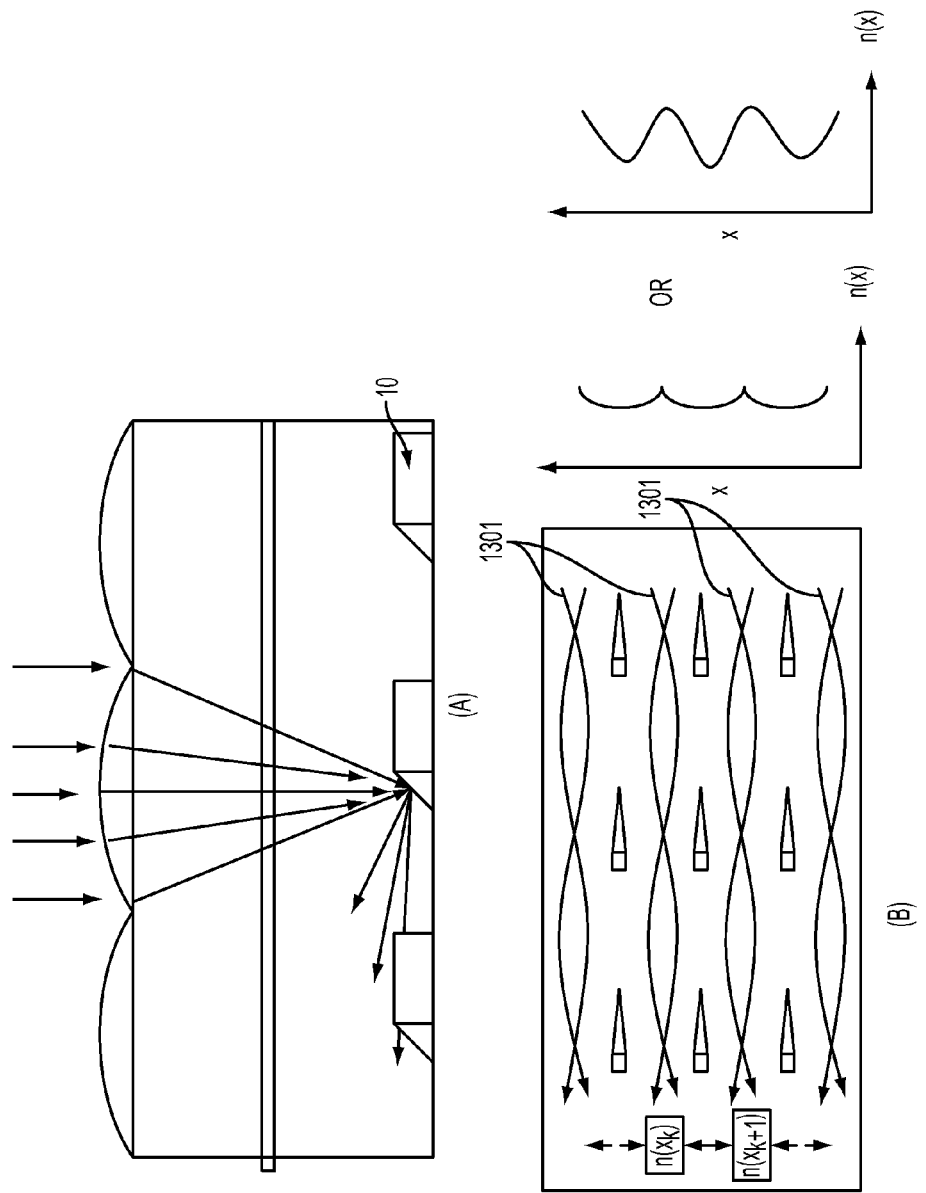
FIGS. 15A, B are a side cross sectional view and a top cross sectional view, respectively, of a GRIN-based light collection and concentration system, according to another exemplary aspect of the invention.

In a second illustrative example, linear or parabolic gradients could be placed in strips 1301 in the z-direction with the gradient in the x-direction as illustrated in FIGS. 15A, B. Here, n(x) is low (minimum) at each z-axis dimple location and high (maximum) at the midpoints between adjacent dimples in the z-direction. This type of gradient would minimize the optical path near each surface injection element by bending light into the free space between dimples. Such a gradient would take the form $$n(x_k)=N_0+N_{01}|x_k|+N_{02}x^2_k,$$

or $n(x_k)=N_0+N_S \sin(b^*x_k)$ where $x_k$ is the x-position with respect to the $k^{th}$ dimple in the x-direction, and b is dependent on the spacing of the dimples, $N_{01}$ is the linear gradient coefficient, $N_{02}$ is the second order gradient coefficient, and $N_S$ is the sinusoidal gradient coefficient.

Figure 16:
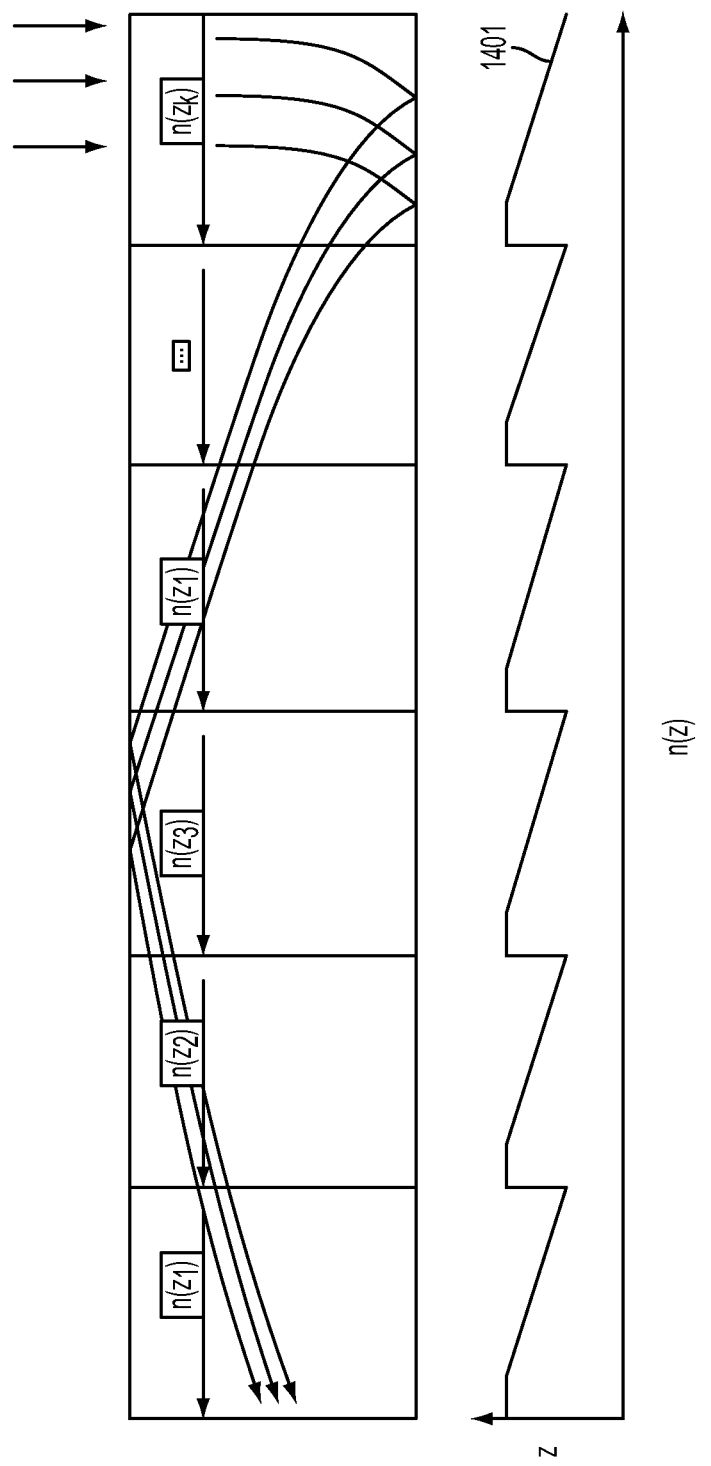
FIG. 16 is a side cross sectional view of a GRIN-based light collection and concentration system, according to another exemplary aspect of the invention.

In a third illustrative example, a series of y-axes strips 1401 of strong gradient could be placed with the gradient along the z-direction and uniform in the x-y plane, as illustrated in FIG. 16. The gradient, along with a first TIR reflection from the bottom surface of the guide layer, would act as the injection mechanism, leaving the guide layer itself free of disruptions to the guide geometry. Such a gradient would take the form $$n(z_k)=N_o+N_Oz_k.$$

In this case, the guide layer may have index discontinuities along the z-axis, which could limit the length of the guide and the upper limit of concentration due to Fresnel losses along the guide layer, unless these discontinuities were eliminated.

In different aspects, the light collection and concentration system according to an embodiment of the invention may be considered as one-sided and two-sided.

As discussed above, the guide layer transports light from each injection facet to the exit aperture of the light guide. The light guide uses total internal reflection (TIR) for nominally lossless propagation of the light, but the guide contains dimples, which interfere with propagation efficiency. Light can only interact with the dimples a few times before angles exceed the critical angle, and this limits the guide length. The TIR angle (or guide numerical aperture) is defined by the difference in index between the guide layer and bounding media. This interface can be with air or a lower index material. For instance, the lenslet layer may be cemented to the guide layer but separated therefrom by a lower-index polymer layer.

Figure 10:
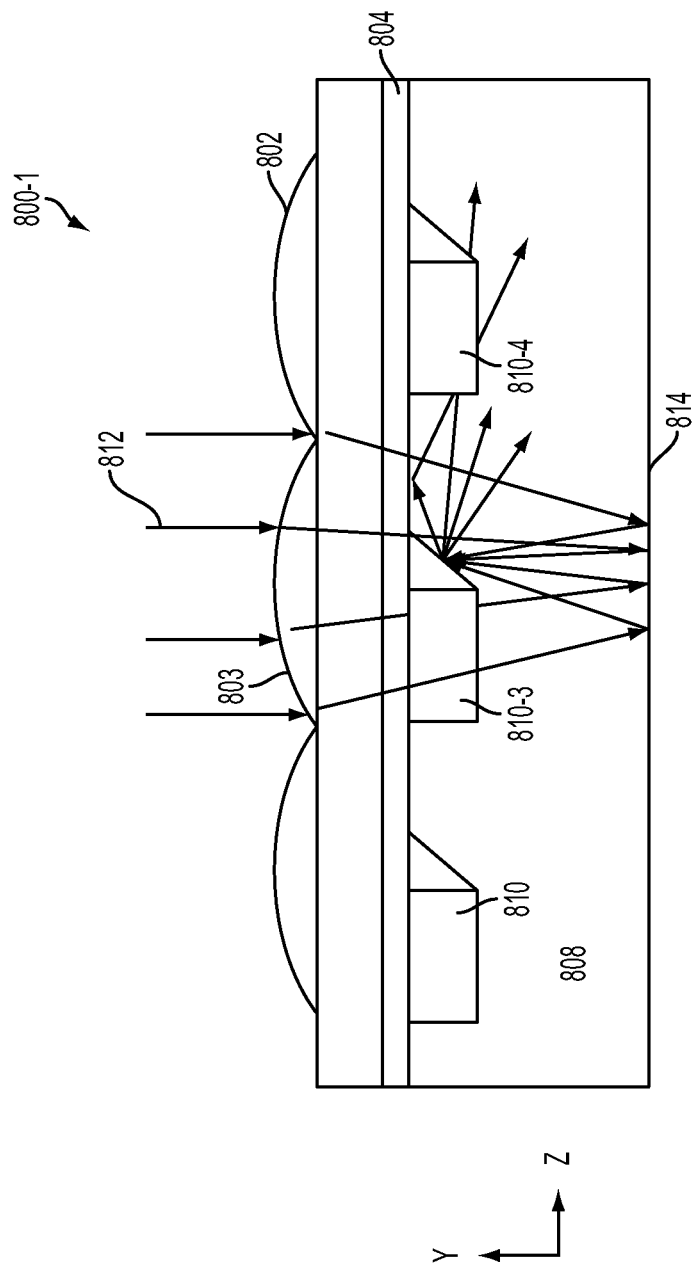
FIG. 10 schematically shows in cross section a one-sided light collection and concentration system, according to an exemplary aspect of the invention.

FIG. 10 shows a schematic, cross sectional view of an illustrative one-sided light collection and concentration system 800-1. According to an exemplary aspect, the one-sided system 800-1 includes a light guide layer 808 including dimples 810 disposed in a top surface thereof, a low-index TIR layer 804 disposed immediately adjacent the top layer, a refractive lenslet array 802 disposed immediately adjacent the TIR layer, and a mirror layer 814 on the bottom surface of the guide. As illustrated, incident solar light 812 is concentrated by lenslet element 803 onto the mirror surface and further concentrated onto respective (to the lenslet element) injection facet 810-3. As the light propagates via TIR in the z-direction, some of it encounters the bypass element of dimple 810-4.

This one-sided system is advantageous because, among other things, the system is folded in half (with respect to the two-sided system, discussed below), thus the thickness of the system is reduced, which reduces weight and material used. Moreover, the lenslets and dimples can be formed by one tool, are formed in potentially the same process step, minimizing the registration errors from a given manufacturing technology. The nominal performance of the one sided light guide, including cover glass, is expected to be greater than 70%.

Figure 11:
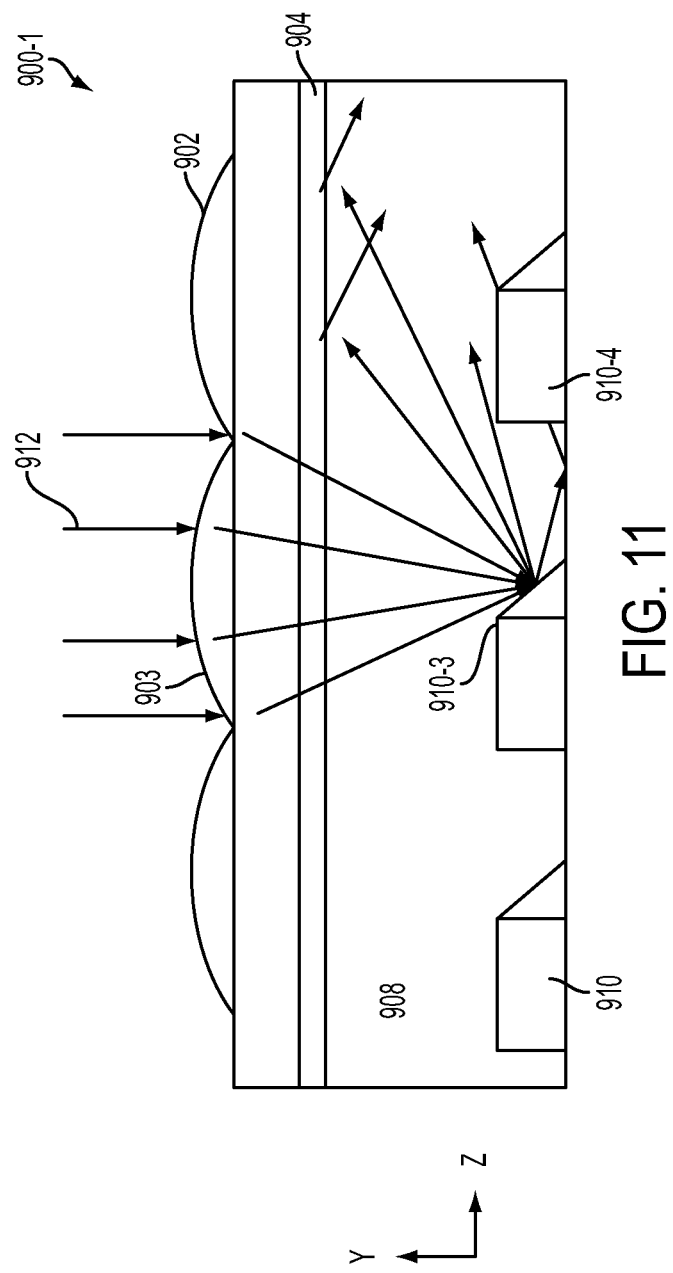
FIG. 11 schematically shows in cross section a two-sided light collection and concentration system, according to another exemplary aspect of the invention.

FIG. 11 shows a schematic, cross sectional view of an illustrative two-sided light collection and concentration system 900-1. Somewhat similar to the one-sided system of FIG. 10, the two-sided system 900-1 includes a light guide layer 908 including dimples 910 disposed in a bottom surface thereof, a low-index TIR layer 904 disposed immediately adjacent the top layer, and a refractive lenslet array 902 disposed immediately adjacent the TIR layer. As illustrated, incident solar light 912 is concentrated by lenslet element 903 onto injection facet 910-3. As the light propagates via TIR in the z-direction, some of it encounters the bypass element of dimple 910-4.

In this aspect, the lenslets and dimples are formed by separate tools, whether injection molded, compression molded, UV curved, or formed from glass. The two separate components are registered and positioned with respect to one another. The dimple structure may be contained within the same part that forms the guide layer or could be formed in a separate layer and cemented to a guide layer substrate. The TIR layer will be composed of a low index material or can simply be an air gap. This layer prevents propagating light from interacting with the lenslet surface, which could significantly decrease the concentrating abilities of the guide.

As described above, the light propagated in the guide layer is out-coupled at the exit end thereof. While the thickness, T (y-dimension), of the guide layer may be on the order of 3 mm-5 mm in an exemplary aspect, the width, W (x-dimension), of the guide layer need not be constrained except that the structure is intended to cumulatively concentrate all of the light input to the guide layer at the exit end for ultimate input to a PV cell. The limited entrance aperture of a PV cell located adjacent (advantageously, immediately adjacent) the exit end of the guide layer may benefit from further concentration of the propagating light, in which case a secondary concentrator between the exit end of the guide layer and the PV cell will be advantageous.

Figure 13B:
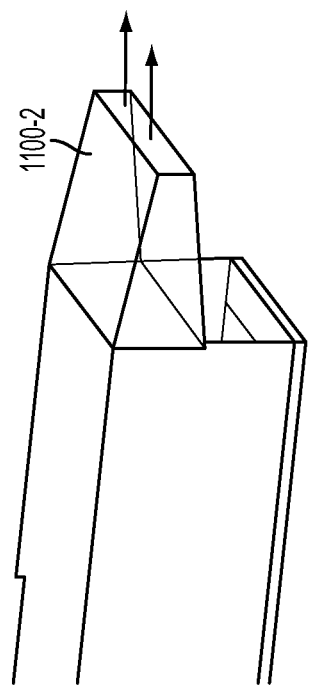
FIGS. 13A, 13B show perspective views of alternative, shaped, secondary light concentrators in the form of a parabolic concentrator and a straight-trapezoidal concentrator, respectively, according to non-limiting, illustrative aspects of the invention.
Figure 13A:
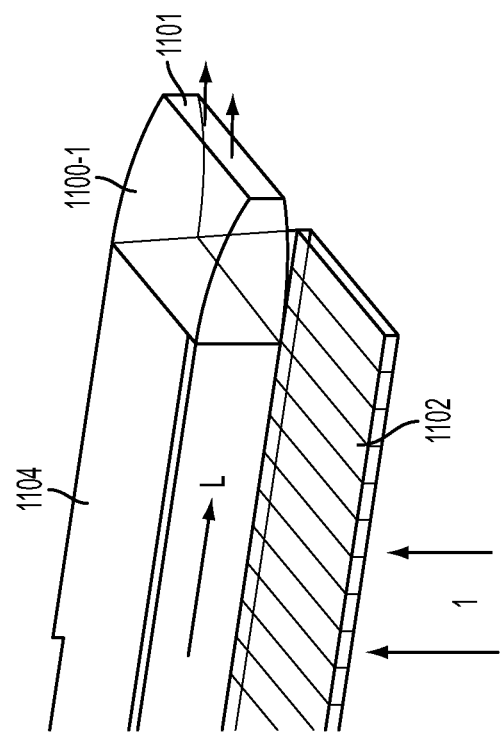

FIGS. 13A, 13B schematically illustrate two, exemplary, differently shaped secondary concentrators 1100-1, 1100-2 in the form of a parabolic concentrator and a straight-trapezoidal concentrator, respectively. As shown, for example, in FIG. 13A, a primary concentrator section 1102 has a plurality of primary light concentrators, which focus incident light 1 into a single light guide component 1104 having a respective plurality of light injection elements (not shown) as described herein above. The light is propagated in the light guide in the direction L by TIR. A separate compound parabolic secondary concentrator 1100-1 is shown directly coupled (e.g., cemented) to the exit end of the light guide, whereupon the surface 1101 of the secondary concentrator becomes the ultimate exit end of the light guide. Rather than being a separate component, the secondary concentrator 1100-1 (1100-2) may be an integral end of an extruded or molded light guide in the shape of a compound parabola (1100-1) or straight trapezoid (1100-2), for example (other appropriate shapes are not excluded). Depending upon the design of the secondary light concentrator, propagating light may continue to be totally internally reflected until out-coupled or, may be otherwise reflected until out-coupled. Accordingly, the secondary concentrator may be of the same or a different material than the light guide; may be solid, hollow, gas-filled, or otherwise constructed as appropriate to perform its intended function.

The nominal performance of the system depends on the number of optical surfaces (Fresnel losses), the coupling efficiency from lenslets and dimples into the guide, the transmission efficiency within the guide, and any material absorption losses. Since this aspect only has one low index-material interface, Fresnel losses are minimal. Without a cover glass, Fresnel losses account for roughly a 5% loss. A cover glass adds roughly another 10% loss. The coupling efficiency at the dimple depends mainly on dimple size and the prescribed acceptance angle of the system. The nominal design has at most 2% losses from coupling into the guide. Transmission efficiency is the most important issue to address and is dependent on a number of parameters. For a nominal light guide length of 500 mm, the optical efficiency of the two sided system, including cover glass, has been demonstrated to be greater than 80%. The increase over the one-sided aspect comes from light loss savings due to the absence of the mirror surface layer and shadow losses from interruptions to the lenslet apertures.

In order to optimize system performance, it is helpful to understand the effect and interactions of the constituent parts of the dimpled light guide. Étendue "transfer" from input aperture through the lenslets, off each dimple injection facet, and into the guide layer is limited only by Fresnel and absorption losses, injection facet size, and injection facet angle. If the injection facet is undersized, a portion of the acceptance angle and input aperture will simply miss the dimple and be lost. If the light angles incident on the injection facet do not satisfy TIR, those rays will also be lost or attenuated. This sets two basic constraints on system geometry: minimum dimple size and injection facet angle.

Once in the guide, light transmits down the guide layer and may or may not be diverted by one or more bypass elements, depending on light paths within the guide. The goal of the guide is to transfer light from the injection point to the exit point with as few of these interactions as possible. The guide transfer efficiency depends on a number of interlinked parameters. The guide itself acts in much the same way as a kaleidoscope with one surface having periodic disruptions; i.e., the dimples.

Figure 5:
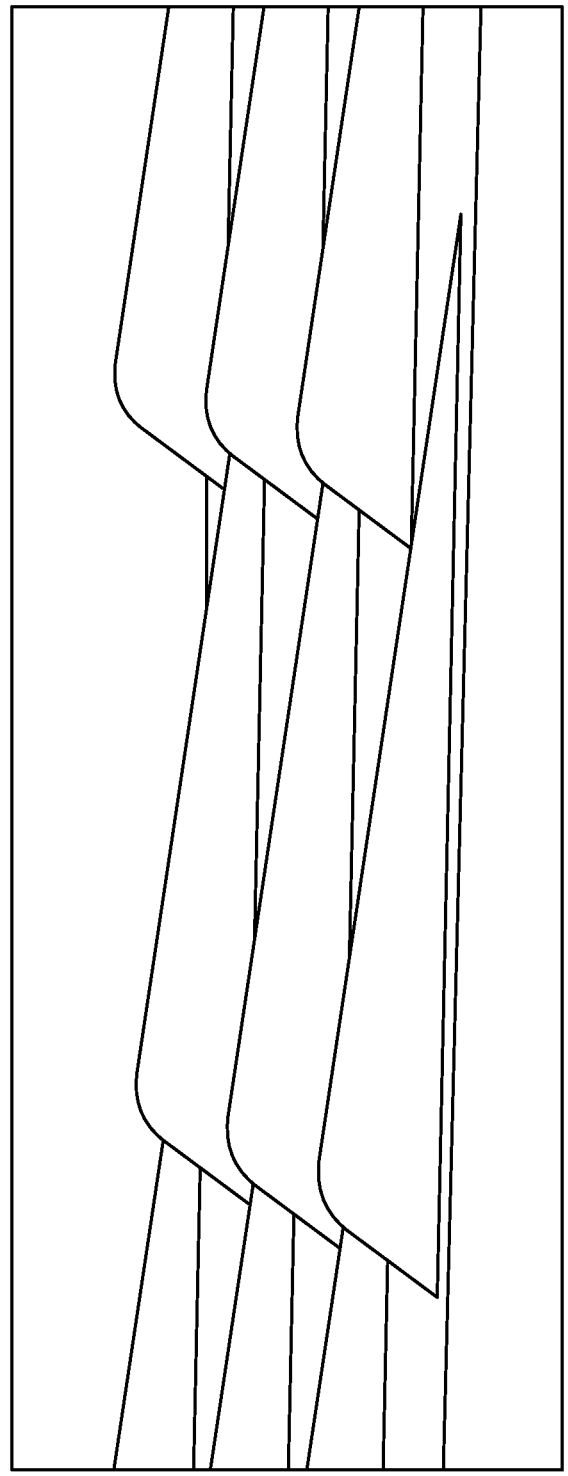
FIG. 5 is an electron microscope image of dimples of the light guide as disclosed in the parent application, according to an illustrative embodiment of that invention.

FIG. 5 is an electron microscope image of 'dimples' (each comprising a light injection element and an integrated bypass element or 'tail') of the light guide. Although this design is suited to light concentration of about 100× or less, the 'dimpled' light guide concept will benefit from an extension to a substantially higher concentration regime, to thus be competitive with alternative concentrator solutions. The embodiments described herein below allow for substantially higher concentrations, but continue to take into account the manufacturing considerations of the dimple design disclosed in the parent application.

As disclosed above, a 'dimple' according to the instant light guide apparatus invention is generally designated throughout by reference numeral 10, and refers to a structural configuration of the planar light guide in the form of an angled, transverse cut into the top or bottom layer of the light guide layer forming a facet. The face of the facet cut into the light guide material medium having an index of refraction $n_1$ also has refractive index $n_1$. The facet may have a reflective coating and/or may be immediately adjacent a TIR medium having an index of refraction $n_2$ that is less than $n_1$.

Figure 6:
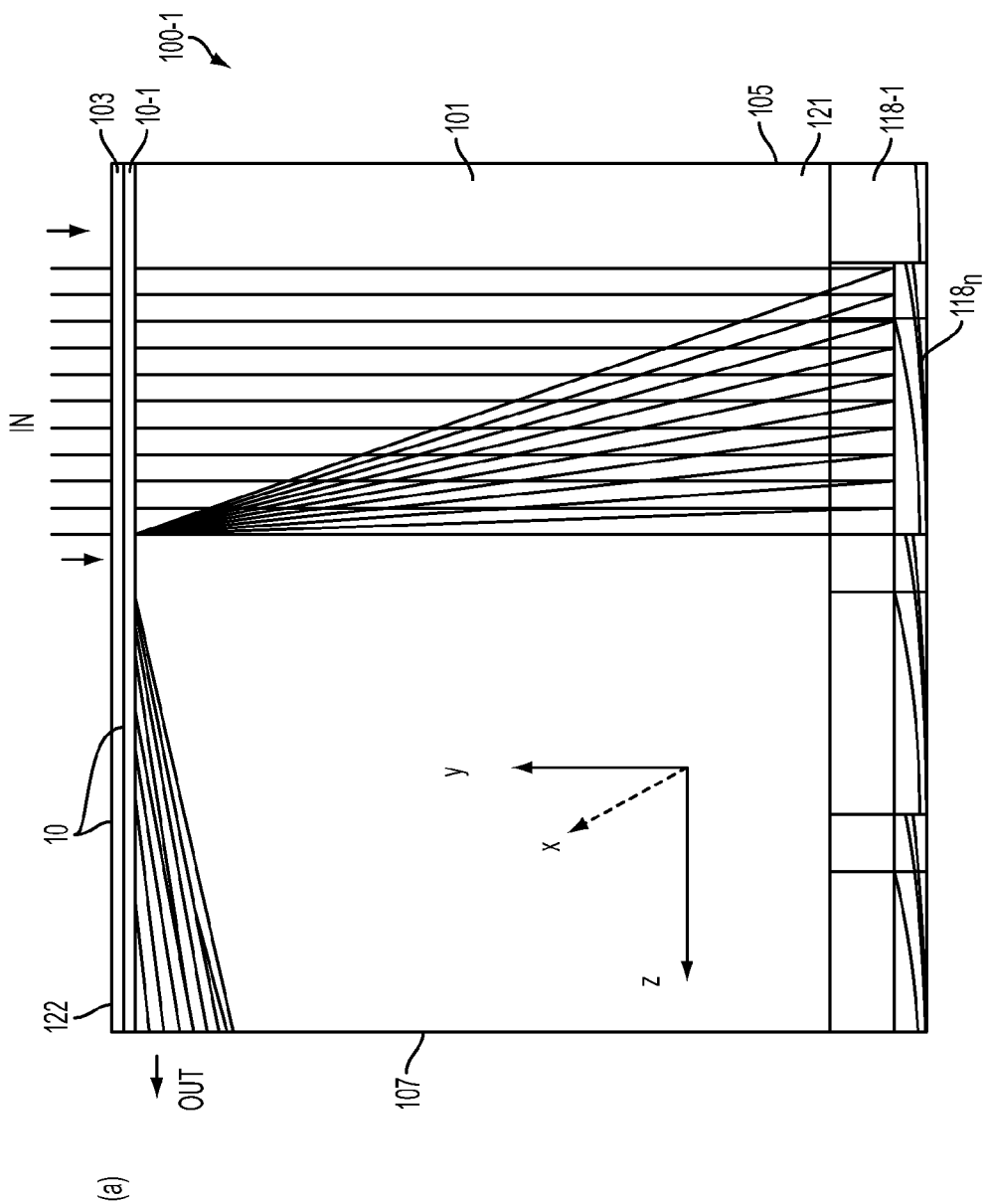
FIGS. 6(a, b) are schematic, cross sectional, elevation views of light guide apparatus according to alternative exemplary embodiments of the invention; a) reflective system; b) refractive system.
Figure 6:
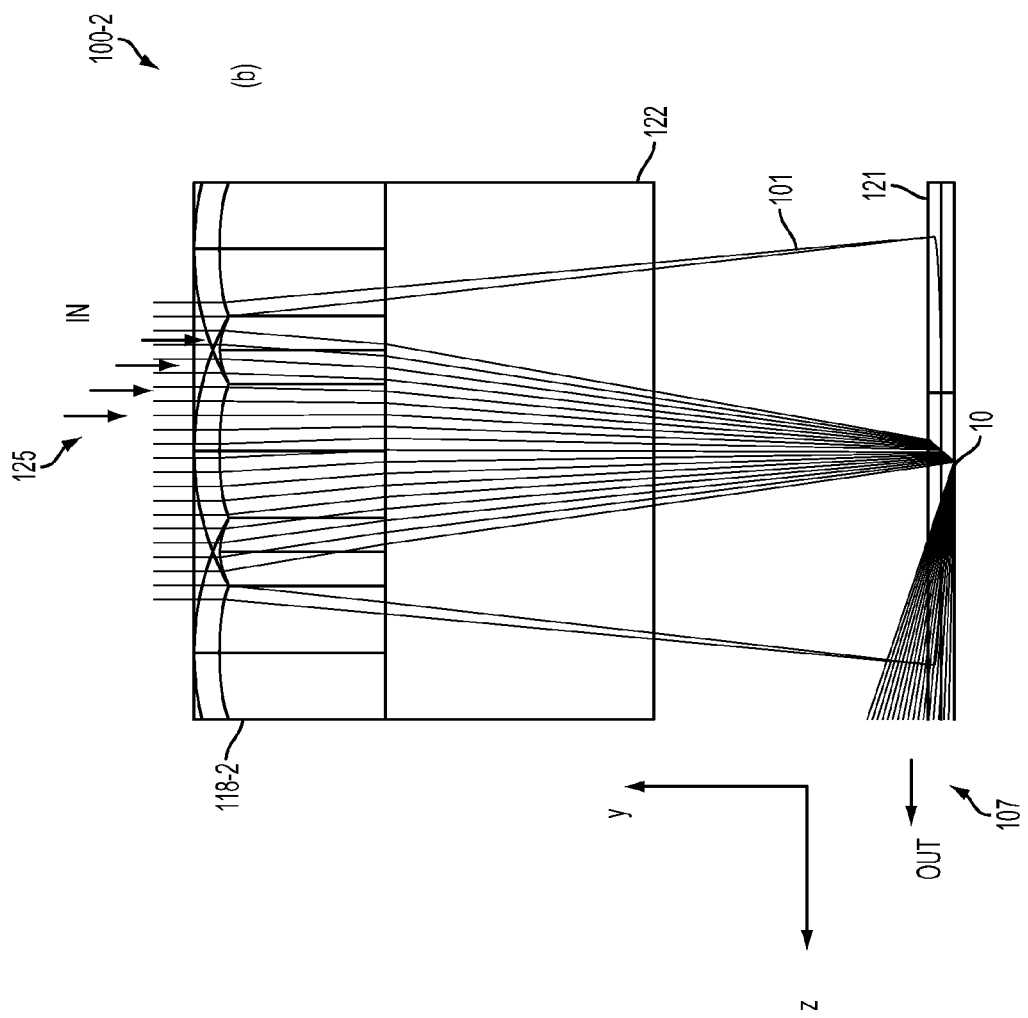

An exemplary reflective-type light guide apparatus 100-1 is illustrated in cross section in FIG. 6a. The light guide apparatus 100-1 in its basic form includes a light guide layer 101 having a top surface 103 and a bottom surface 105. At least one of the top and bottom surfaces is a substantially planar surface (both are planar as shown in FIG. 6a). The light guide layer 101 also has a transversely oriented side-end surface 107 that forms an output aperture of the light guide. The light guide layer is an optically transparent (transmissive) medium characterized by an index of refraction, $n_1$, and has a length dimension in an intended light propagation direction towards the output aperture 107, where the intended light propagation direction is a z-axis direction of a Cartesian coordinate system as shown superimposed in FIG. 6a. Non-limiting, exemplary light guide layer materials include NBAK-1 ($n_1$~1.57), borofloat ($n_1$~1.47), and others known in the art. The light guide layer also includes a plurality of light injection elements (dimples) 10 formed in the top surface 103 of the light guide layer, referred to as the dimple layer 10-1. The dimples may be oriented at an injection angle of about 45 degrees such that incident light general normal to the top surface of the light guide (i.e., the (−y-direction) will be turned 90 degrees and propagate down the light guide in the z-direction, as illustrated in FIGS. 1 and 3.

To functionally operate as a solar light guide, the apparatus further includes a primary light concentrator array 118-1 comprised of concave mirror elements $118_n$, disposed adjacent the bottom surface 105 of the light guide layer 101. A low index TIR medium layer 121 having an index of refraction $n_2$ ($n_2 < n_1$) is disposed immediately adjacent the bottom surface of the light guide layer intermediate the bottom surface and the primary light concentrator array 118-1. Another low index TIR medium layer 122 having an index of refraction $n_3$ ($n_3 < n_1$) is disposed immediately adjacent the top surface 103 of the light guide layer. The low index layers facilitate propagation of light through the light guide layer along the z-axis direction by total internal reflection. The low index layers may be air or some other solid, liquid or gaseous medium satisfying the TIR condition. A cover medium (not shown) may be disposed adjacent the low index medium 122. Thus as illustrated in FIG. 6a, parallel rays of solar radiation 125 are incident on the top surface of the light guide layer in the generally (−)y direction (±acceptance angle), and travel transversely through the light guide layer to the primary concentrator array. Incident light reflected from each mirror element $118_n$ is concentrated or focused onto a respective light injection element 10 and reflected therefrom to propagate down the light guide layer in the z-direction towards the exit aperture 107 via TIR within the light guide layer.

A refractive system 100-2, according to an alternative exemplary embodiment is similarly illustrated in FIG. 6b, where the primary light concentrator array is composed of refractive lens elements and is disposed adjacent a top surface of the light guide layer. In the refractive system illustrated in FIG. 6b, solar radiation 125 is incident on the lens array 118-2, which focuses the incident light onto respective injection facets 10 disposed in the bottom surface of the light guide layer. The light is reflected from the facets and propagates via TIR down the waveguide layer.

In the exemplary aspect of the light guide apparatus 100-1 illustrated in FIG. 6a, the optical elements $118_n$ of the primary concentrator array 118-1 are parabolic reflectors. Parabolic reflectors may provide advantages over refracting elements such as, for example, no chromatic aberrations and thus a smaller focal spot on each injection facet. This allows the injection facets to be smaller and thus increases the guiding efficiency of the system. Although reflective elements may cause shadowing losses, a reflective primary concentrator array provides better guiding capability leading to superior performance at higher concentrations.

To maximize guiding efficiency, the cone of light produced by each concentrating/focusing element should be deflected directly down the guide, perpendicular to the angle of incidence. In a previously disclosed design, this corresponds to a 45° injection facet angle for a cone of light symmetric about an axis normal to the guide plane. The light to be injected into the guide must satisfy TIR, which limits the facet angle based on the numerical aperture of the focusing element and the index of the dimples as shown in the equation $$\theta_{Inj} \leq 90° - \sin^{-1}(NA_{lenslet}) - \sin^{-1}(1/n)$$

For materials with an index of refraction of approximately 1.5, a 45° injection facet will only couple a small NA down the guide before TIR is no longer satisfied. Small input apertures of the focusing element require a high density of injection facets, and thus dramatically reduce guiding efficiency. Having an injection angle of less than 45° increases the angles with which the light travels down the guide, resulting in both more frequent dimple interactions and an increased light ejection rate.

Figure 17:
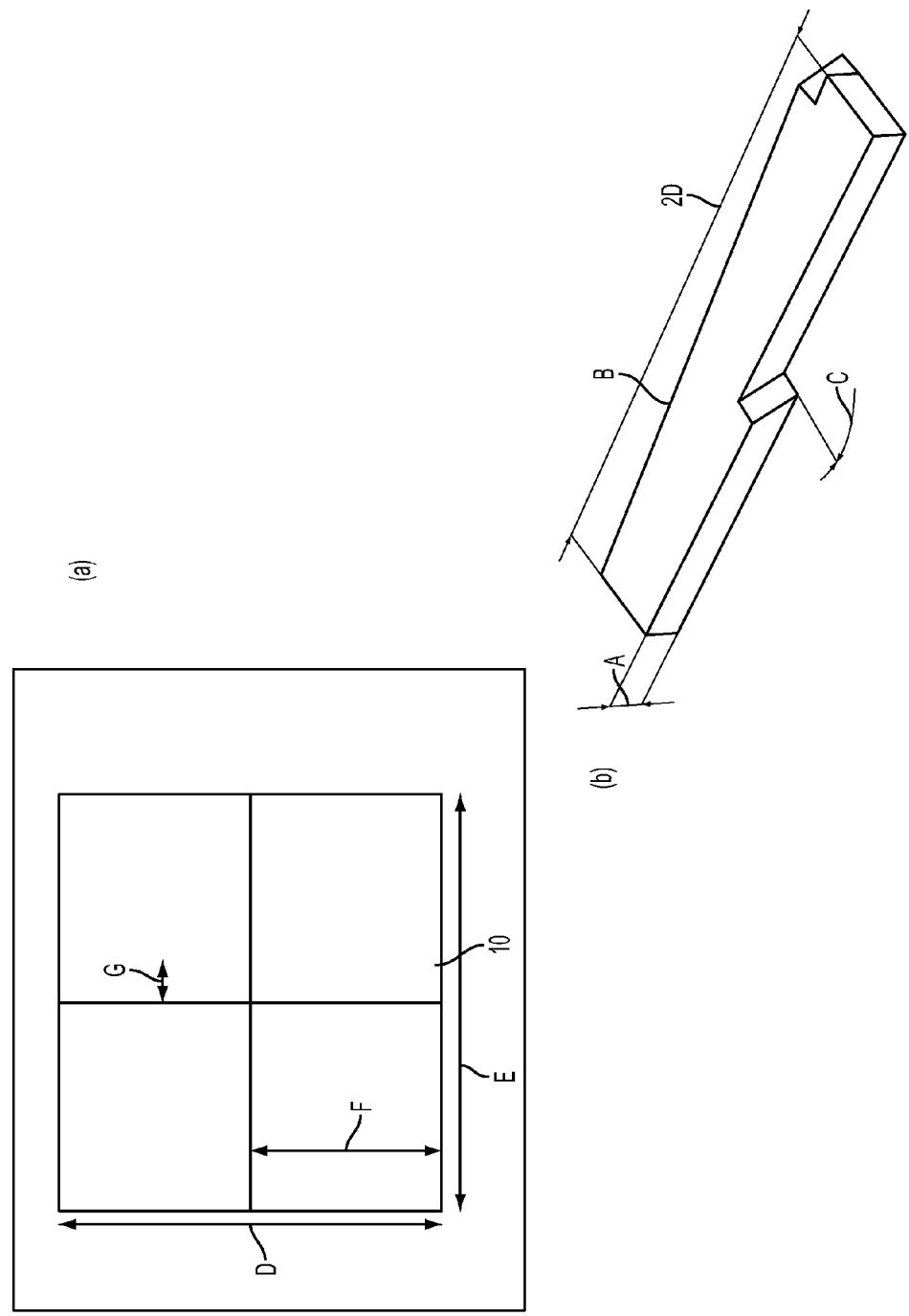
FIGS. 17(a, b), respectively, show a schematic line drawing of a primary light concentrator element and its physical relationship to a dimple strip, and a schematic perspective view of a dimple strip indication dimensional parameters, according to illustrative aspects of the invention.
Figure 18:
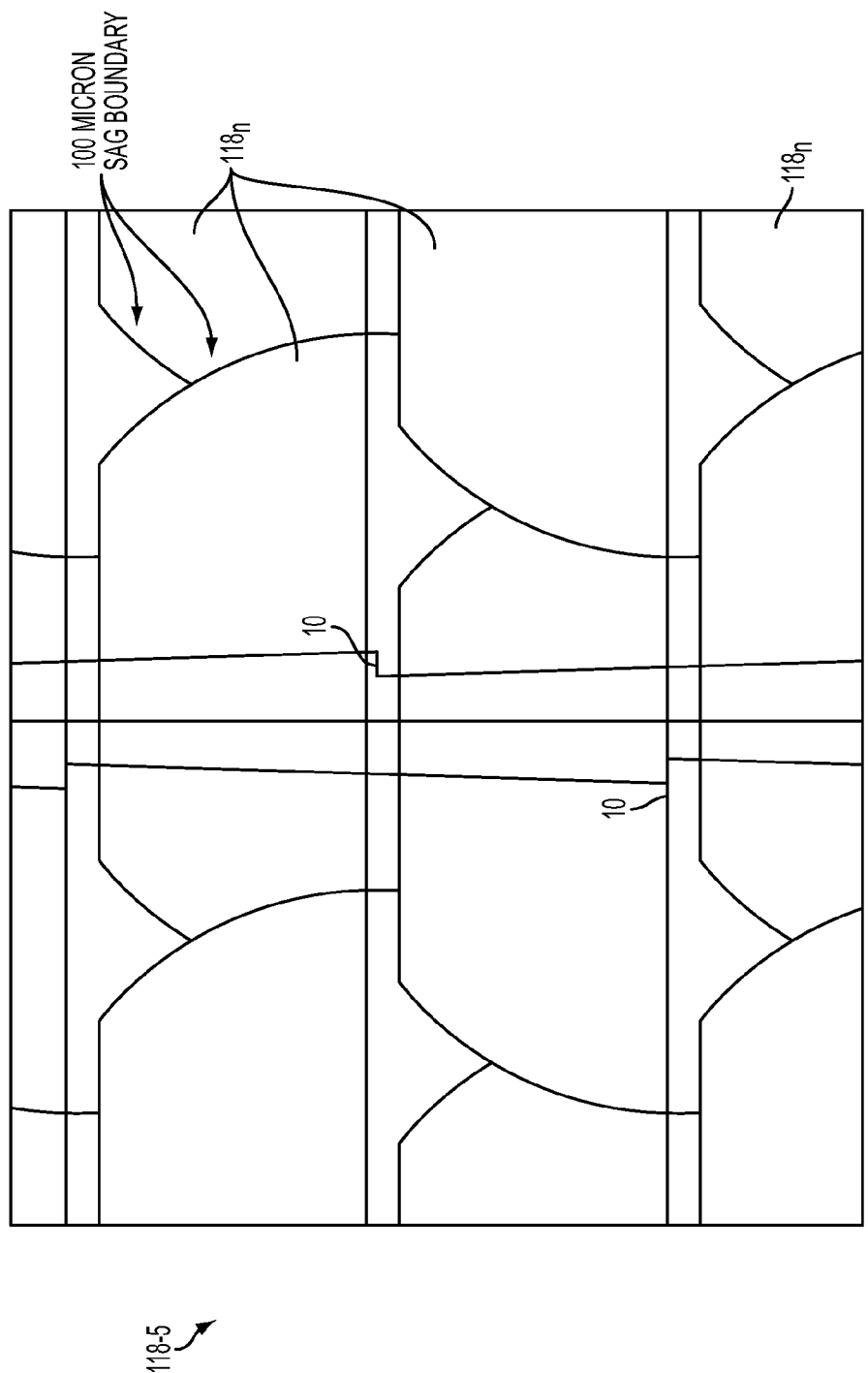
FIG. 18 is a schematic line drawing of the primary light concentrator array of FIG. 19, showing the alignment of each of the mirror elements with respective light injection facets, according to an illustrative aspect of the invention.
Figure 19:
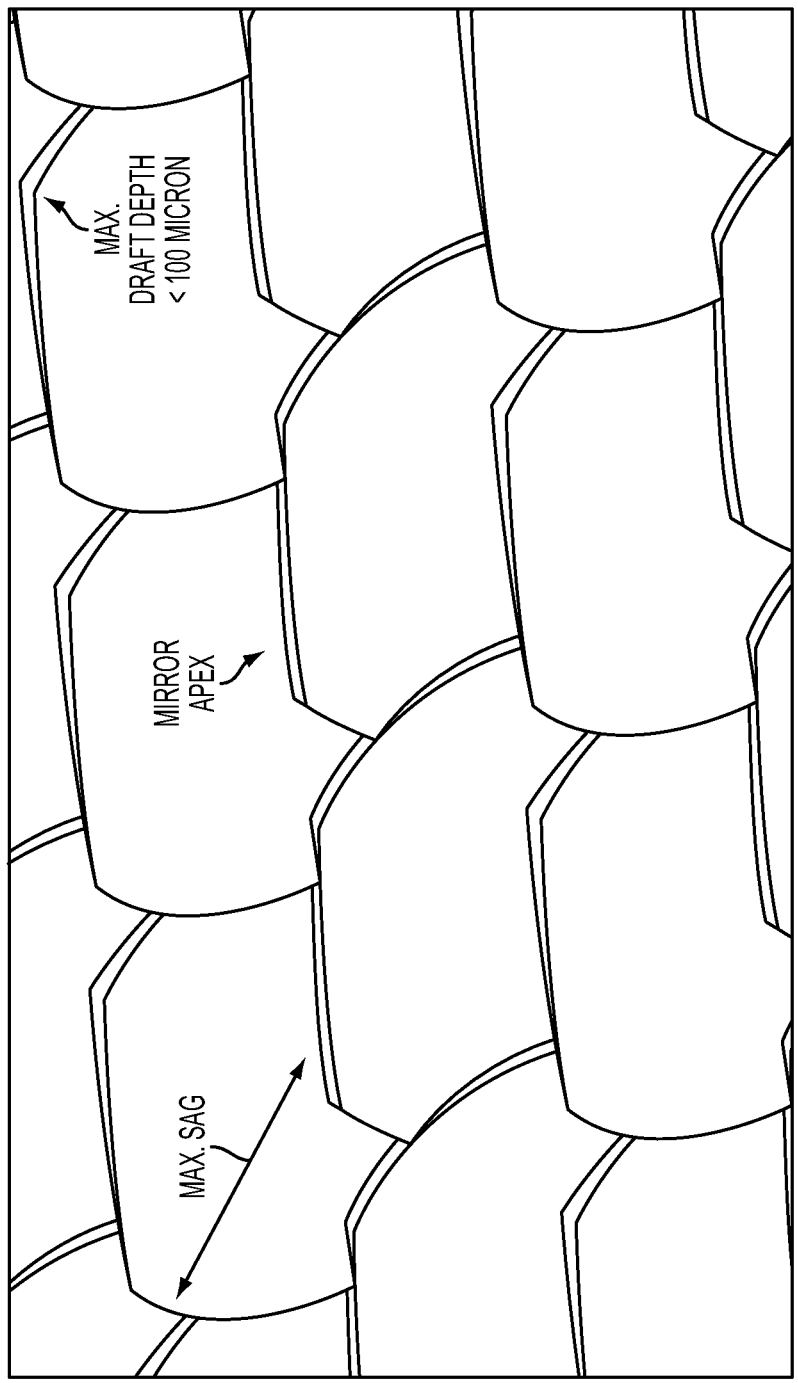
FIG. 19 is a schematic illustration of a tessellated, primary light concentrator array of parabolic mirrors having offset apertures, according to an illustrative aspect of the invention.

In the instant exemplary aspect, in order to achieve a larger input aperture while continuing to satisfy TIR at the injection facet, the mirror elements $118_n$ are offset such that their optical axes are no longer in the center of their input apertures, as shown in FIGS. 17(a), 18 and 19 (described further below). The offset geometry eliminates the rays with the highest incident angle on the injection facet, and thus will allow a larger input cone on each injection facet while still injecting the light along the guiding direction. This will also change the optimal injection angle to be greater than 45°, as the ray in the center of the injection cone is no longer perpendicular to the guide plane. An optimum injection angle was determined to be 46.5° based upon the exemplary apparatus parameters listed in Table 1, with reference to the parameters labeled in FIGS. 17(a, b). As illustrated in FIG. 17(a), the aperture of each focusing element was chosen to be rectangular so that the input numerical aperture could be optimized for both dimensions.

TABLE 1

| | A: Dimple Height | B: Injection Angle | C: Rotation Angle | D: Lens Extent (Guiding) | E: Lens Extent (Non-Guiding) | F: Lens Offset (Guiding) | G: Lens Offset (Non-Guiding) |
|---|---|---|---|---|---|---|---|
| Value | 72 μm | 46.5° | 8.0° | 0.85 mm | 1.62 mm | 0.36 mm | 0.2 mm |

FIG. 18 shows a tessellated primary mirror concentrator array 118-5, illustrated also in perspective view in FIG. 19. The mirror elements $118_n$ are offset parabolas, where the crossing horizontal and vertical white lines in FIG. 18 indicate each mirror's apex, which is aligned directly over a respective injection facet 10. The tessellated, offset parabolic mirror array is further illustrated in FIG. 19. The seemingly odd, irregular mirror perimeter shape maximizes offset and the area for the 100 μm sag over a less efficient faceted Fresnel mirror, and improves coupling into the light guide layer.

Figure 20:
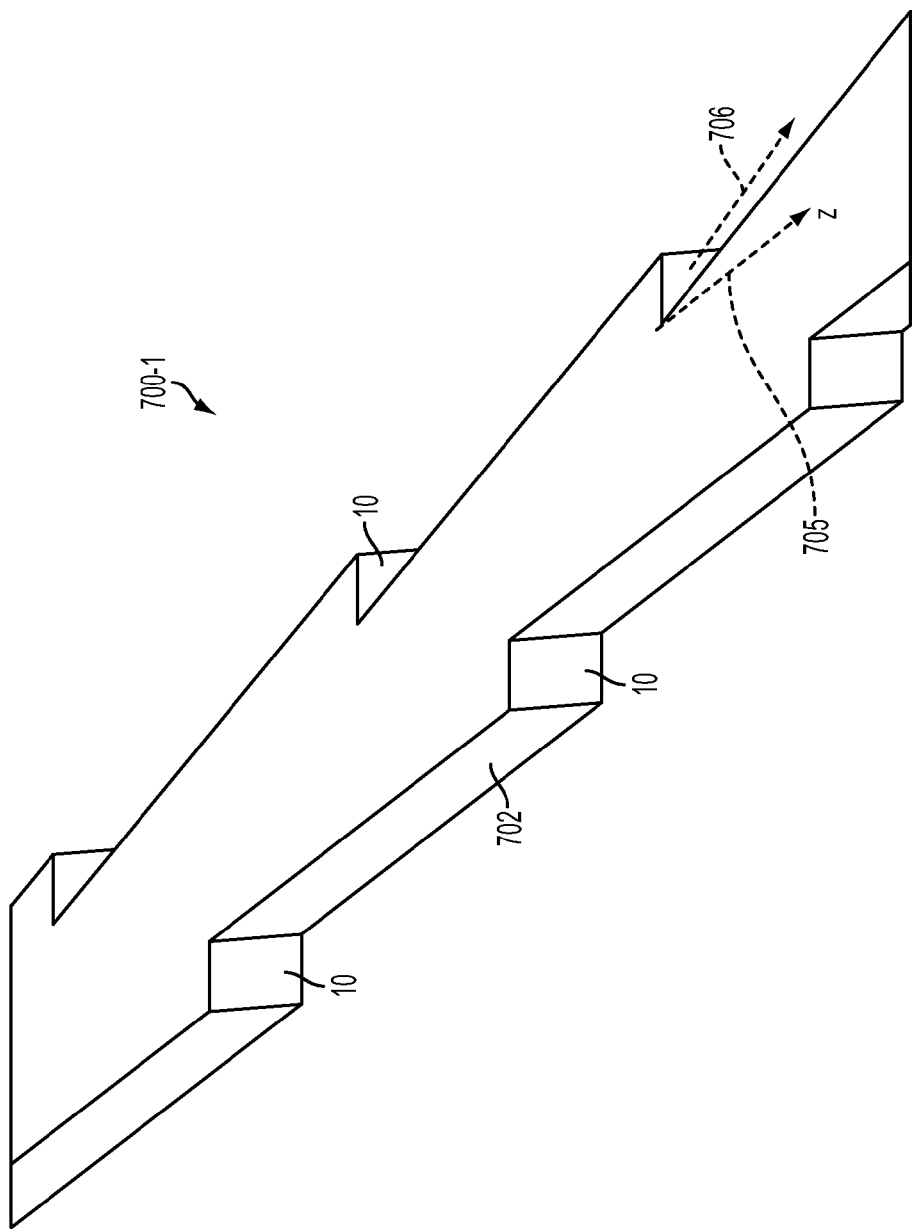
FIG. 20 shows a schematic perspective view of an alternate-type configuration dimple strip according to an exemplary aspect of the invention.
Figure 21:
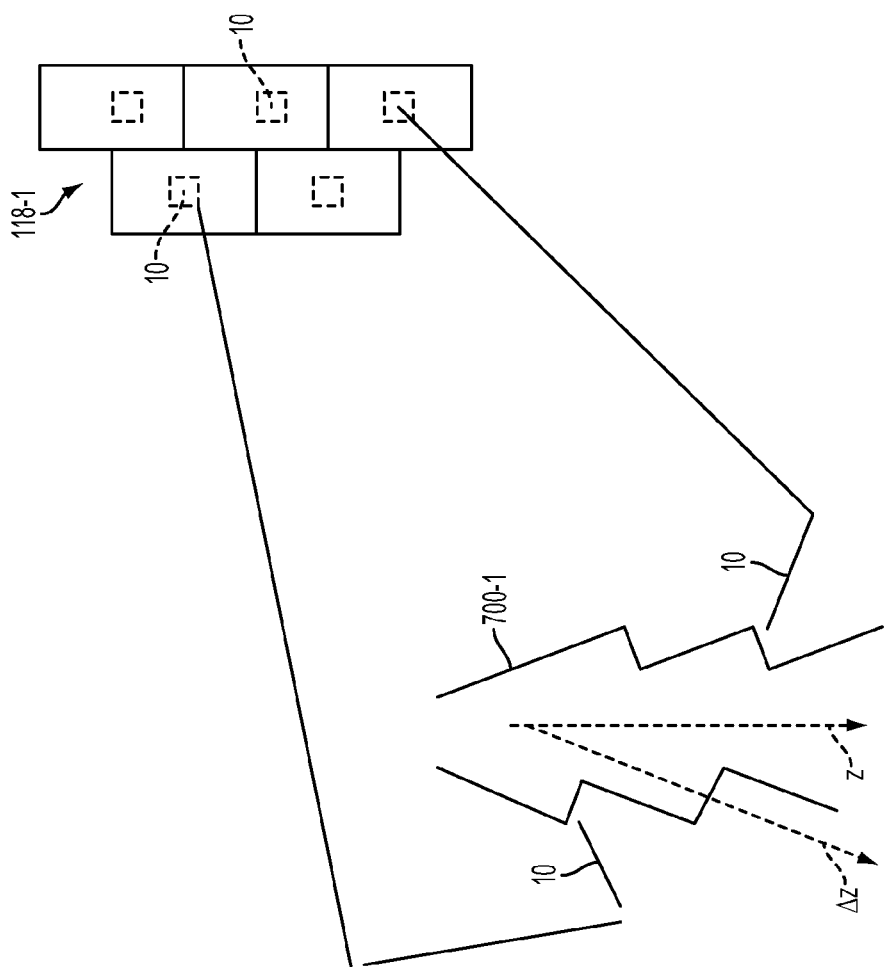
FIG. 21 further schematically illustrates the alternate-type configuration dimple strip shown in FIG. 20 associated with a tiled, primary light concentrator array, according to an exemplary aspect of the invention.

FIG. 20 shows a schematic perspective view of an alternate-type configuration dimple strip 700-1 according to an exemplary aspect of the invention. As illustrated, a linear plurality of dimples 10 are disposed on both sides of a strip 702. The white dotted arrow 705 represents the z-direction; the black dotted arrow 706 represents the rotated direction of the dimple, and the angle there between, Δz, is the rotation angle of the dimple. The rotation angle of each dimple (in this exemplary aspect set to 46.5°) shields each successive downstream facet from light reflected from each preceding facet. In this exemplary aspect, the dimples on opposite sides of the strip alternate in position relative to each other to correspond to a tiled or tessellated primary light concentrator array 118-1 as illustrated in FIG. 21; i.e., each facet or dimple is directly aligned with a respective mirror apex as illustrated in FIG. 18. The dimple features were combined into a long strip with injection facets on both sides and a slight wedge to shield each successive facet, as shown in FIG. 18. The strip geometry provides a top surface parallel to the guide plane, and thus any ray travelling down the guide that interacts with the top surface will not increase in propagation angle relative to the guiding direction. This also minimizes the shadowing loss, as light travelling through this flat region will not be deviated, and thus will still focus onto the injection feature. This geometry also maximizes secondary concentration possible at the end of the guide, as light propagating down the guide will only increase in angle defined by the guide plane. This yields a small angular spread in the angle perpendicular to the plane of the guide, and thus increases the possible secondary concentration.

The input numerical aperture perpendicular to the guiding direction is limited by the shadowing of the injection facets at higher angles. Having a larger input aperture in this dimension is advantageous, as it decreases the density of the injection features, and thus the lenslet aperture is also offset to decrease the shadowing of the injection face. The injection facet is rotated about the axis perpendicular to the guide plane so that it faces away from the prism structure. This minimizes the angles in the plane of the guide so that the light that is immediately deflected by the dimple has a lower initial propagation angle.

Figure 22:
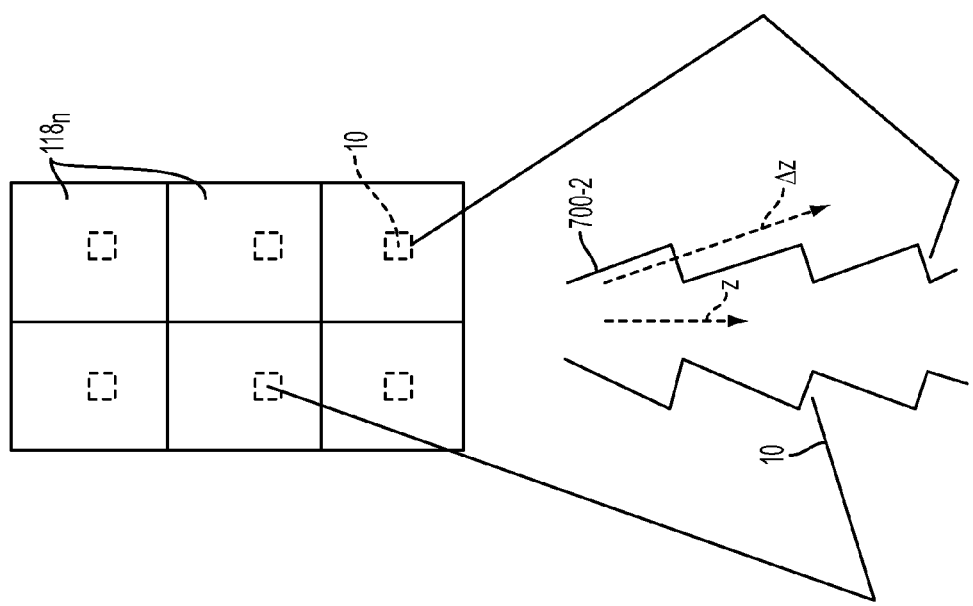
FIG. 22 schematically illustrates an opposite-type configuration dimple strip associated with a regular, aligned primary light concentrator array, according to an exemplary aspect of the invention.

FIG. 22 illustrated an alternative exemplary aspect of a dimple strip 700-2 in which the dimples 10 on opposing sides of the strip re opposite each other, thus this is referred to as an opposite-type dimple strip. In this aspect, the primary concentrator array 118 has an aligned and regular configuration as shown.

Figure 23:
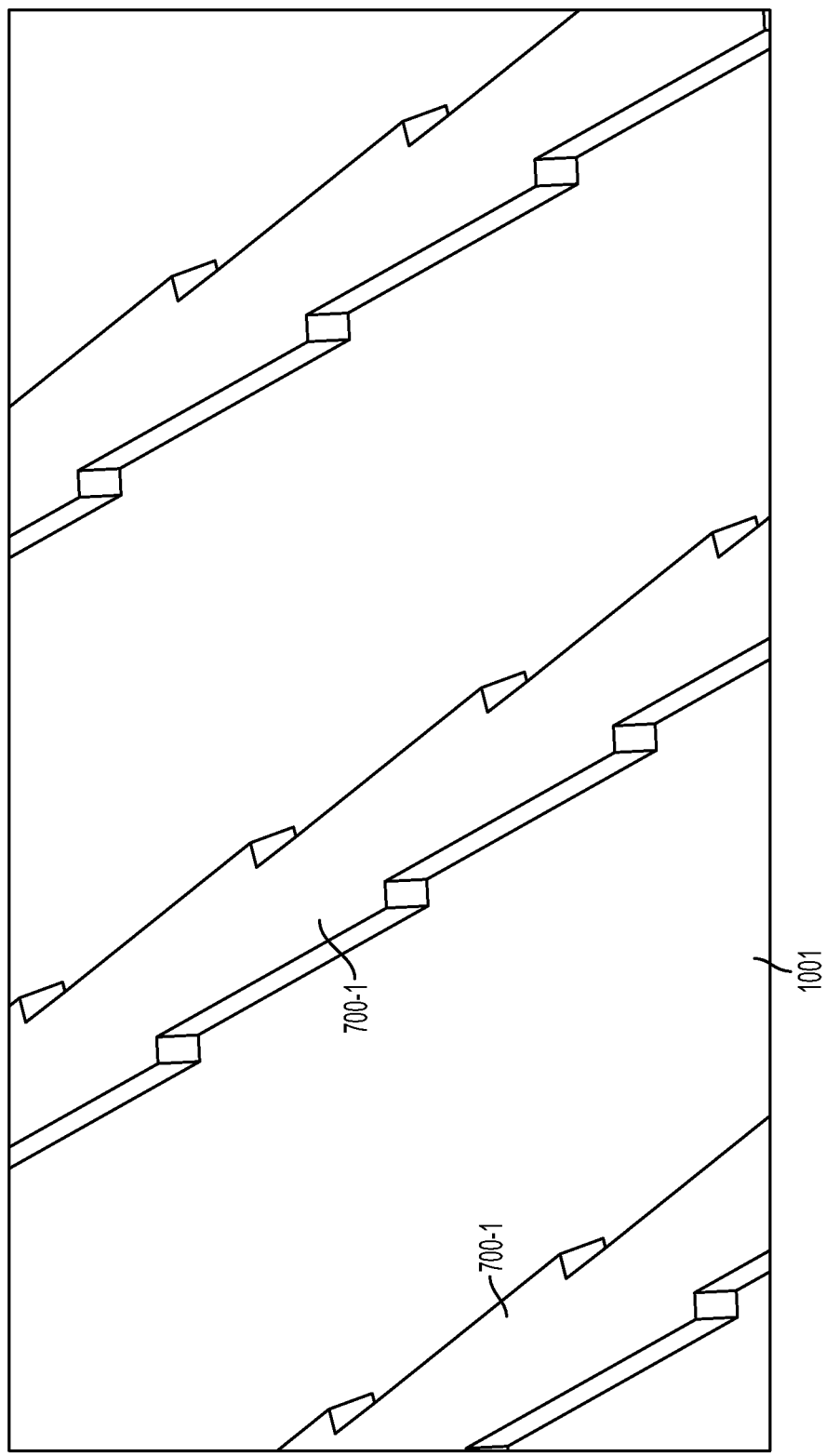
FIG. 23 schematically shows a dimple layer of the light guide layer, comprised of multiple, parallelly arranged alternating-type dimple strips, according to an exemplary aspect of the invention.

FIG. 23 illustrates a dimple layer 1001 which consists of a plurality of dimple strips 700-1 arranged parallel and in lengthwise (z-direction) orientation in the top surface of the light guide layer. As illustrated, the dimple strips are alternate-type dimple strips.

As described above, the light propagated in the guide layer is out-coupled at the exit end thereof. While the thickness, T (y-dimension), of the guide layer may be on the order of 3 mm-5 mm in an exemplary aspect, the width, W (x-dimension), of the guide layer need not be constrained except that the structure is intended to cumulatively concentrate all of the light input to the guide layer at the exit end for ultimate input to a PV cell. The limited entrance aperture of a PV cell located adjacent or immediately adjacent the exit end of the guide layer may benefit from further concentration of the propagating light, in which case a secondary concentrator between the exit end of the guide layer and the PV cell will be advantageous.

Figure 24:
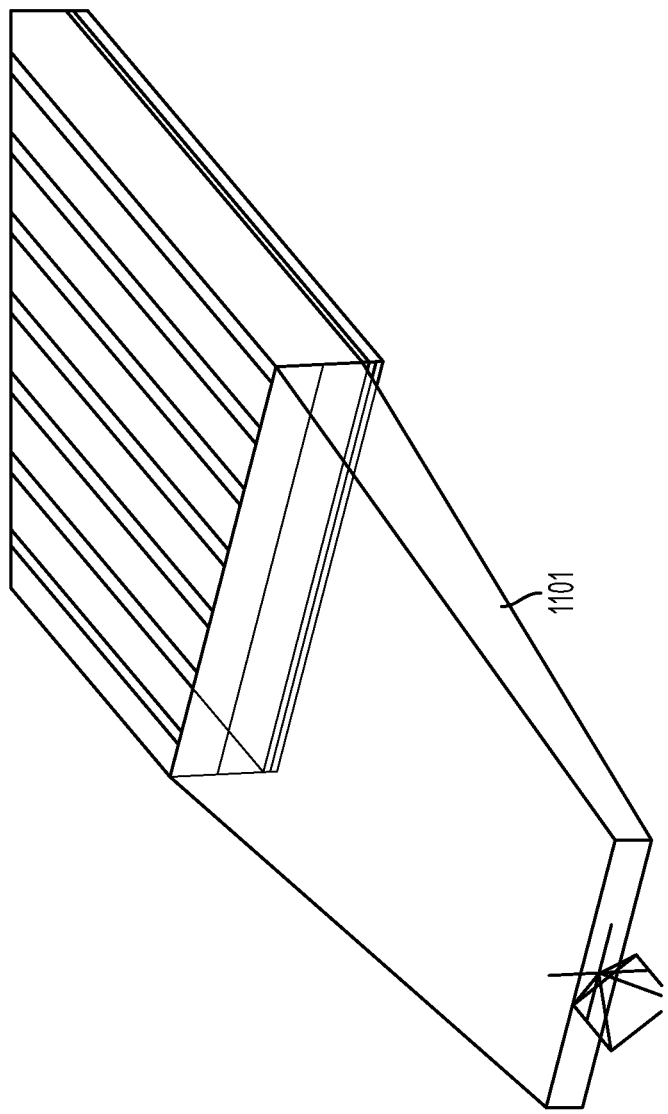
FIG. 24 schematically shows a flat-walled secondary concentrator coupled to the light guide apparatus, according to an exemplary aspect of the invention.

FIG. 24 schematically illustrate a flat-walled secondary concentrators 1101 coupled to the output edge of the light guide apparatus.

Modeled Performance

Figure 25:
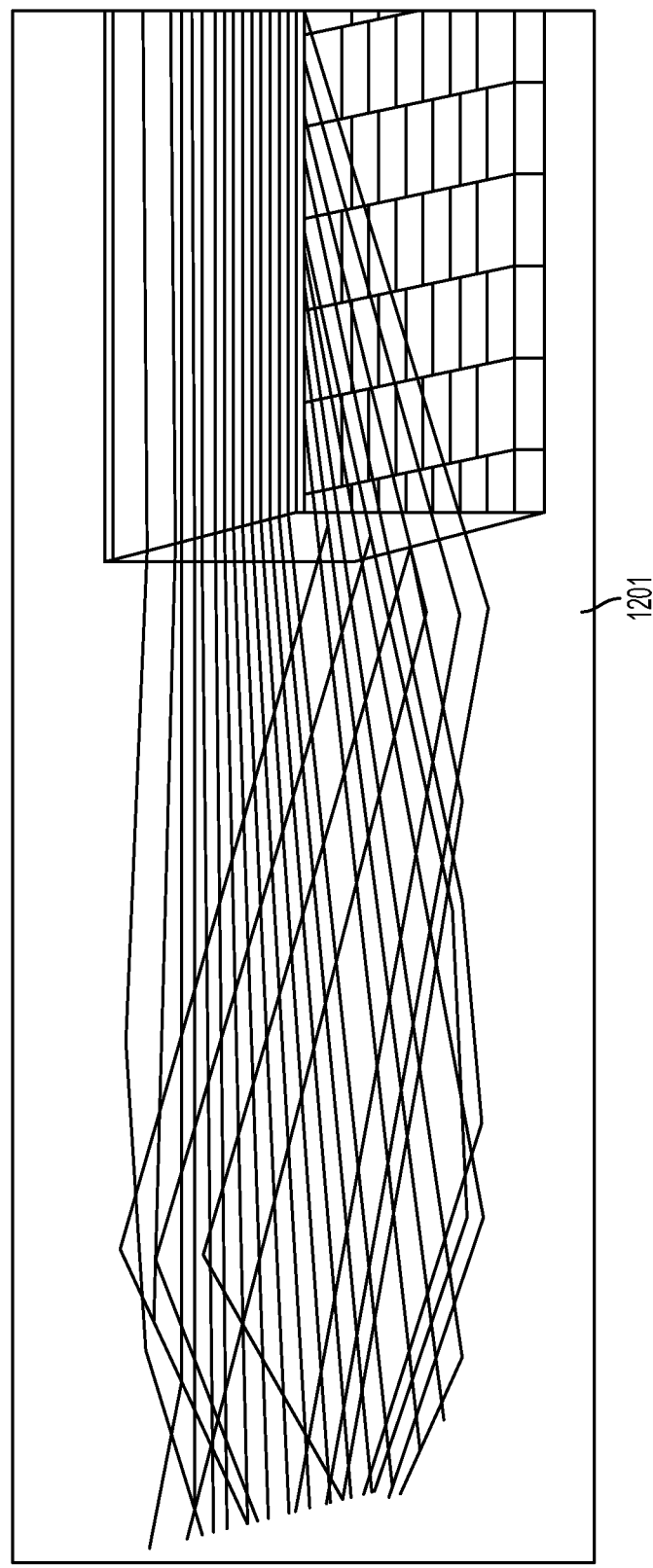
FIG. 25 illustrates a curved secondary concentrator according to an illustrative aspect of the invention.

An exemplary apparatus such as 100-1 illustrated in FIG. 3 was modeled using a light guide layer 101 of NBAK-1, a high index glass with high transmission. NBAK-1 has a refractive index of approximately 1.57, which will support TIR at incident angles of 50° or less. The dimple layer 10-1 and reflector layer 118-1 were modeled as also being NBAK-1, though for fabrication purposes they may advantageously be made out of an index matched silicone. The low index, TIR medium layer 121 was modeled to have a constant index of 1.38. A reflector element coating was modeled to be silver, with all other surfaces uncoated. A two millimeter guide layer 101 thickness was used, while the low index layer and dimple layer were modeled as being 127 and 125 μm thick, respectively. Light coming from the guide was further concentrated using a curved secondary concentrator 1201, as illustrated in FIG. 25. This was modeled to be a one dimensional concentrator extruded along the long dimension of the output face of the light guide, as several small two dimensional secondary concentrators were considered impractical for cost reasons. In order to account for imperfect tracking of the sun, the system was designed to have an acceptance angle of ±1 degree. These initial conditions were chosen to provide an approximate theoretical performance limit on this design form, while considering only realistic materials and providing realistic performance when mounted on a tracker.

Using this set of initial conditions, the shapes of the dimples 10 and microreflector array 118 were optimized to provide maximum efficiency at high concentrations. The optimum design parameters are listed in Table 1 above. Each injection face has a respective parabolic mirror $118_n$ focusing light onto it. Each mirror extends 0.85 mm in the guiding direction as illustrated by D in FIG. 17(a). The geometric concentration at the output of the guide is 0.395 for each mirror element along the guiding direction.

Figure 26:
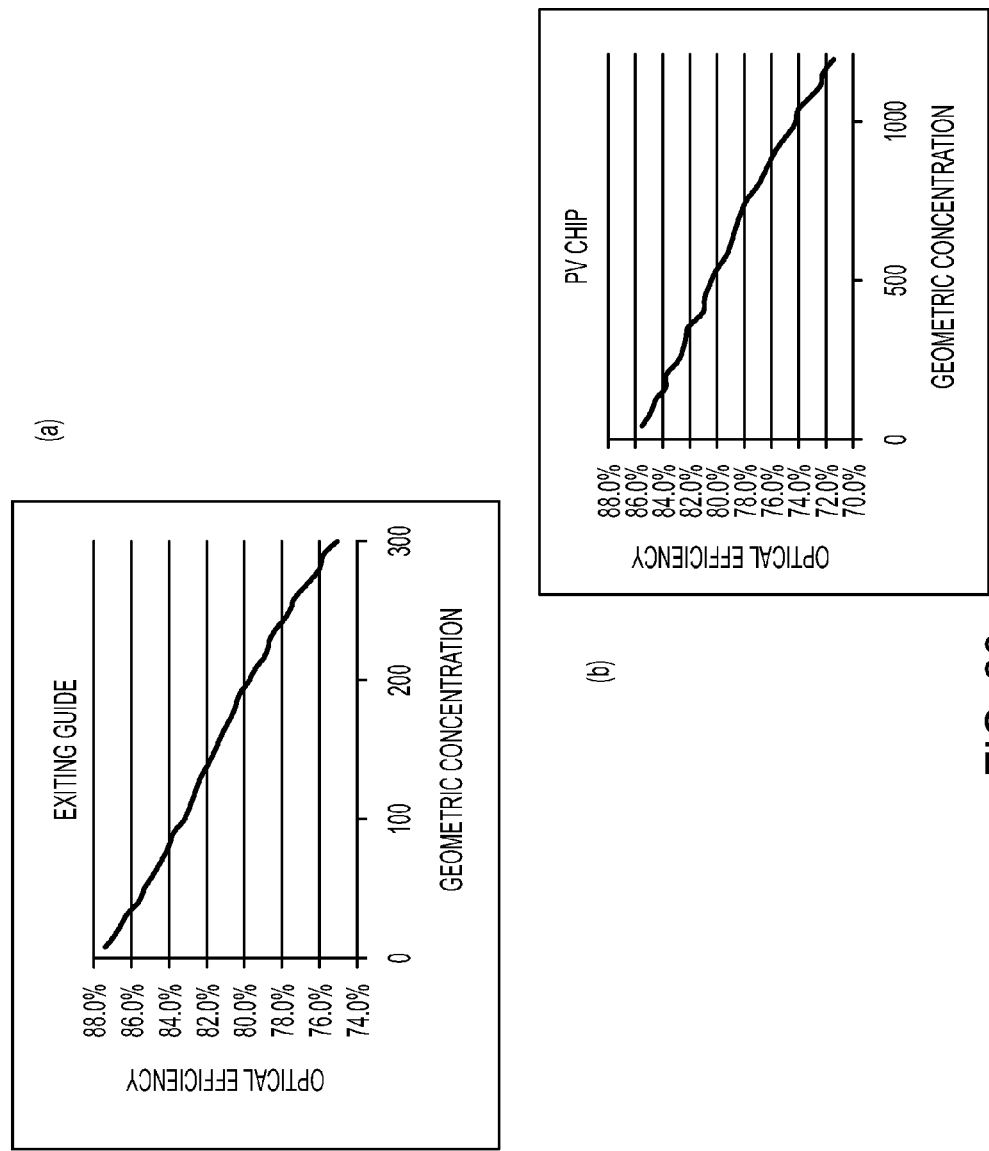
FIGS. 26(a, b) show efficiency curves of a modeled apparatus exiting the guide before secondary concentration (a) and arriving at the chip at the exit face of a secondary concentrator (b), according to an illustrative aspect of the invention.

The modeled apparatus was capable of achieving over 1000× geometric concentration while still having optical efficiencies well over 70%. As the apparatus increases in length along the guiding direction, the geometric concentration will increase, but the optical efficiency will decrease, as light injected farther from the PV chip suffers from absorption and ejection due to repeated interactions with the dimples. The modeled apparatus was 10 mm wide in the non-guiding direction, though the apparatus can be extended to much greater widths with similar performance. This design has a lower optical efficiency at concentrations below 50× relative to previous designs due to the mirror and shadowing loss, but exhibits superior performance at higher concentrations. The optical efficiency of the apparatus as a function of geometric concentration is shown in FIGS. 26(a, b).

Manufacturing

The nominal design described above takes advantage of a high index glass to increase usable injection angles and to gain added concentration in the secondary concentrator. The low absorption of this glass also allows optimal performance at high concentrations. NBAK-1 is considered too expensive to be used in high volume production, thus a less expensive substitute may desirably be used. Borofloat glass is less expensive and has relatively high transmission, and thus offers a more advantageous commercial solution. Borofloat does not have the high transmission of NBAK-1, and the index of refraction is approximately 1.47, which is lower than NBAK-1. There is some variation on the transparency, index, and dispersion of borofloat based on manufacturer, but these were approximated with a Cauchy index profile ($A_0=1.46$, $A_1=0.004$), and a transmittance of 99.6% for every 10 mm of material.

Figure 27:
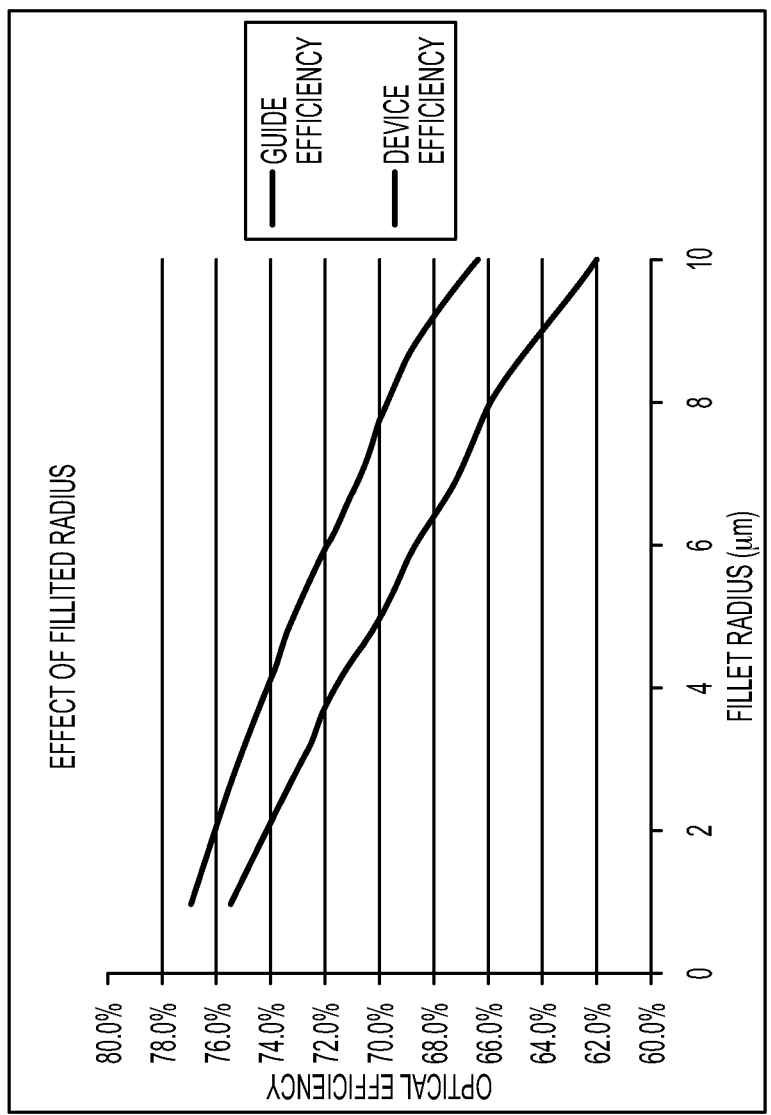
FIG. 27 is a graph showing the effects of fillet radii on device efficiency, according to an illustrative aspect of the invention.

The ideal system has very sharp features. The design described above had edges with a 1 µm fillet radius, which is too small for most production processes. Increased rounding of the features of the dimples will degrade performance in multiple ways. The fillets will increase shadowing loss, as any light incident on the device that passes through a fillet will not be refocused onto the injection facet. Increased fillet size will also require that the injection facet be larger, as the flat portion of the facet must maintain its size in order to keep the field of view required. This larger dimple and increased wedge will reduce the guiding efficiency, as interactions with the bypass elements will be more frequent and cause a larger deflection from the guiding direction. Finally, these rounded features will cause the light to spread into both dimensions as it propagates. The optimal design maintains the injection NA in one dimension, which allows maximum additional concentration in the secondary concentrator, and increasing the fillet radius will reduce the amount of possible secondary concentration. The effect of the fillets on the optical efficiency is shown in FIG. 27, where the concentrator is 450 mm long and has a geometric concentration of 800×.

Figure 28:
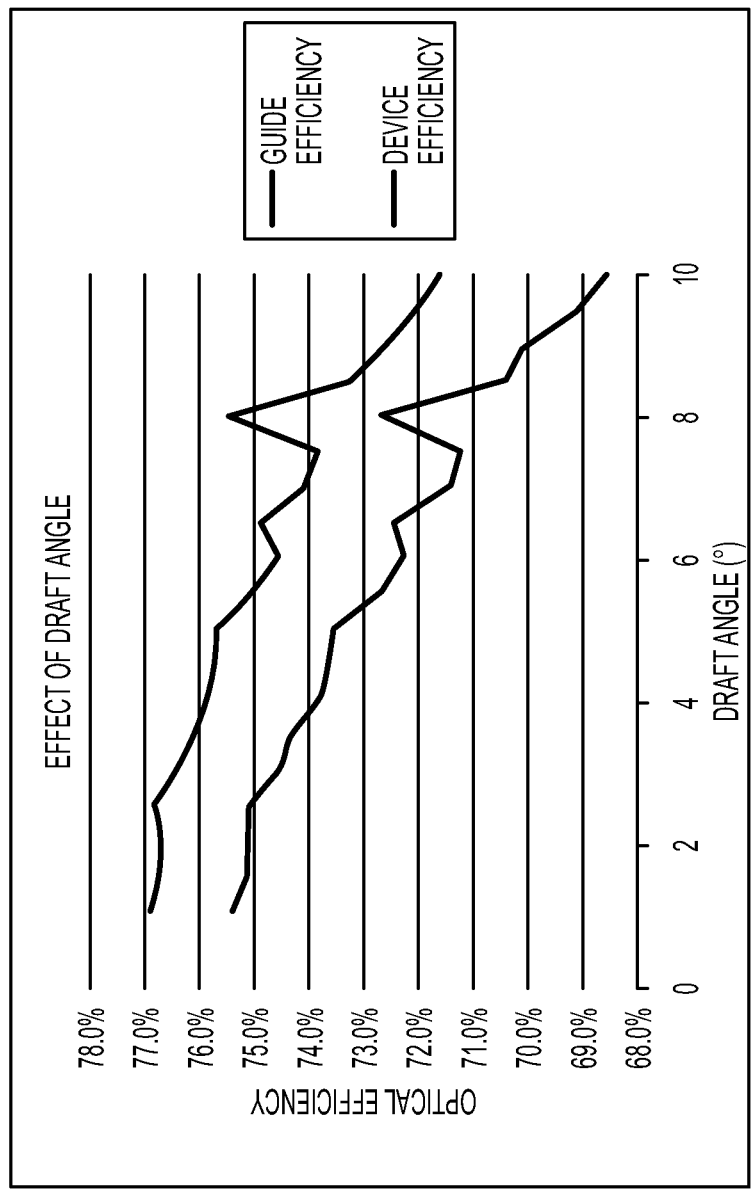
FIG. 28 is a graph showing the effects of draft angle on device performance, according to an illustrative aspect of the invention.

The steep side walls in the design are prohibitive for many manufacturing methods. Features that are too steep prevent the part from being released from a mold, and thus increasing the draft angles of the dimple features will increase manufacturability. When the side walls are no longer steep, they increase shadowing effects and spread propagating light into both directions, which reduces possible secondary concentration. The ideal system was modeled to have 1° draft angles, as a small draft actually increases performance. Small draft angles prevent light from being trapped in a channel between two strips of dimples and thus being ejected after a relatively short distance. The decrease in performance due to increased draft angles is shown in FIG. 28.

We determined that reasonable limits of manufacturing called for 10 µm fillets and draft angles no steeper than 10°. In previous prototypes, fillets designed to be smaller than 10 µm produced structures that were more rounded than the design called for, and these edges were also rough enough to produce a substantial amount of scattering. These previously fabricated designs also have shown that vertical walls with draft angles of less than 10° will have rough faces, and will be difficult to release from a mold. Fillets of this size and side walls with this draft angle have been achieved reliably, and designs adhering to these limitations can be produced reliably and have the smooth surfaces required for efficient guiding.

Figure 29:
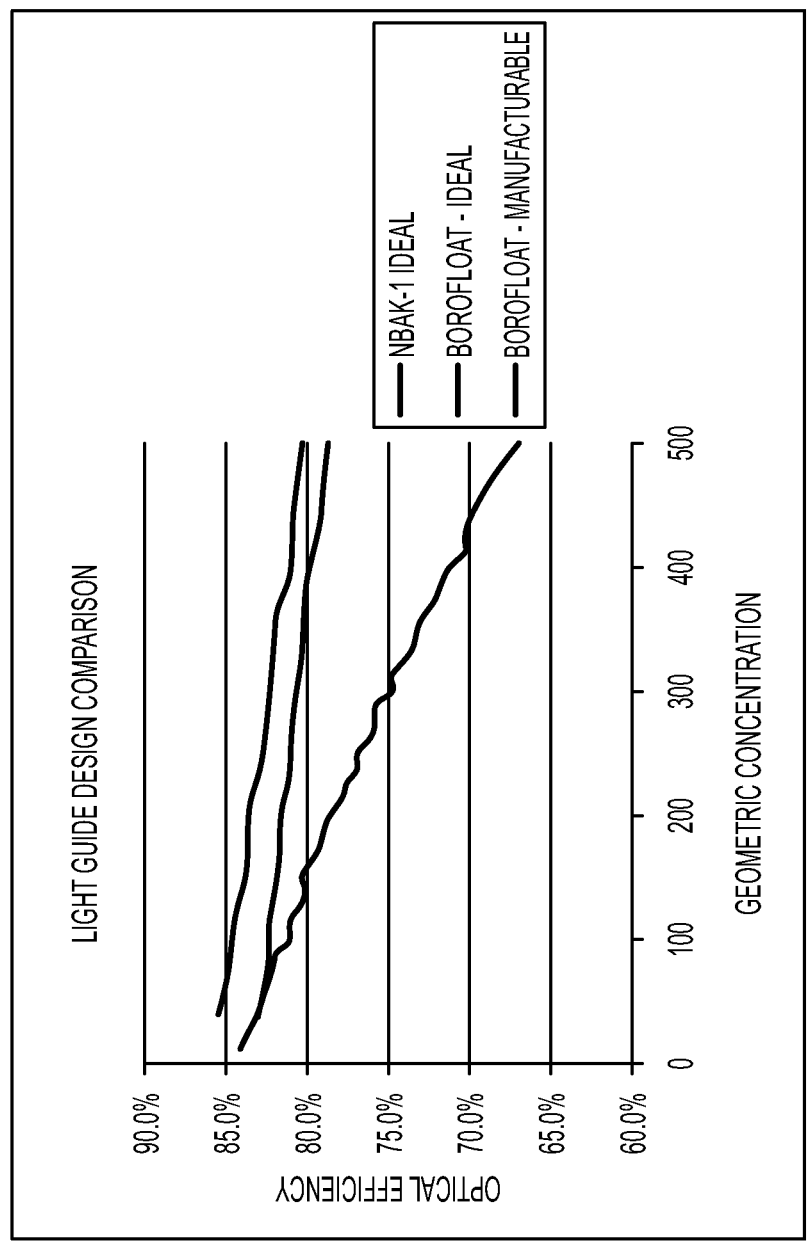
FIG. 29 is a graphical comparison of an ideal modeled design performance and the performance of the apparatus optimized for high volume production, according to an illustrative aspect of the invention.

The apparatus was re-optimized while maintaining these limitations in order to produce an apparatus that could feasibly be manufactured in large volume. The performance of this apparatus was substantially degraded from the originally modeled system, but was still capable of producing high geometric concentration at reasonable optical efficiencies. FIG. 29 provides a comparison of the ideal modeled design performance and the performance of the apparatus optimized for high volume production.

The ideal apparatus geometry is well suited for concentration of up to 1200×, but the design that has been altered to accommodate manufacturing tolerances is better suited to lower concentrations. The performance is most significantly reduced by the fillets of the dimples, though the increased draft angles also adversely affect performance. This design did achieve greater than 70% optical efficiency at over 400× geometric concentration. This design has taken into account the manufacturing limitations which cause the greatest adverse affect on the guide structure, and thus as-built performance should follow this modeling closely.

Previous manufacturing has shown that other factors that are not included in the current model, such as surface roughness and glass inhomogeneity, are not performance drivers, and thus should not cause a drastic deviation from the model discussed above. The curvature tolerance on the reflectors was determined to be a maximum departure of 1 µm at the edge of the aperture, but if the reflector layer thickness is adjusted, a sag error of 10 µm at the edge of the aperture could be compensated for without reducing system performance by more than 2%.

The embodied design can be adjusted to suit a particular application by changing the length of the guide along the guiding direction. A higher concentration can be achieved at the expense of optical efficiency. One version of the apparatus was 320 mm long along the guiding direction and achieved a geometric concentration of 430× with an optical efficiency of 70.1%. If higher efficiency is required and concentrations this high are not necessary, the device could be made shorter. An alternate version was 105 mm long along the guiding direction, achieving a geometric concentration of 150× with an optical efficiency of 80.7%. The apparatus can also be used without a secondary concentrator, which will reduce the geometric concentration, but also the manufacturing complexity. A system with no secondary concentrator that was 125 mm long can achieve a geometric concentration of 60× with an optical efficiency of 80.1%.

A light guide solar concentrator has been designed for high concentration applications while maintaining a high optical efficiency. The 1° field of view provides a reasonable tolerance for existing high end solar trackers. System performance of this ideal design would be competitive with existing systems, while providing many other advantages. The system has been modified to be more readily produced in high volumes to be cost competitive with existing systems using available manufacturing methods.

The apparatus may be further improved upon in many ways to more closely resemble the optimally designed performance. Finding a glass within the cost targets of the system that had a higher refractive index or increased transmission would increase performance closer to the level of the original NBAK-1 design. Any process of producing the dimples with high fidelity that more closely match the optimum design will also increase the achievable efficiency and concentration. Producing sharper edges and steeper side walls will increase the efficiency of the design as shown in the previous section.

Figure 30:
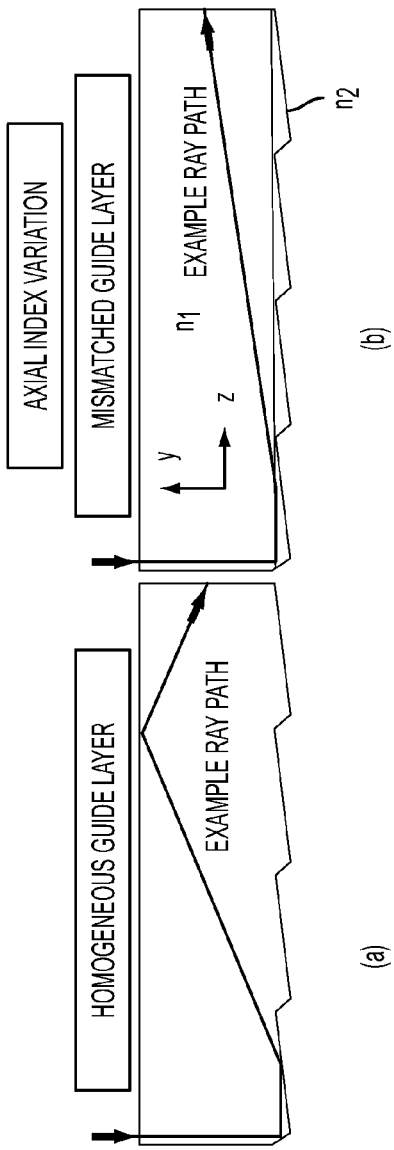
FIG. 30: a) schematic cross sectional view of a light guide apparatus guide layer and injection layer having a homogeneous index of refraction, according to an embodiment of the invention; b) schematic cross sectional view of a light guide apparatus guide layer and injection layer having discretely different indices of refraction, according to an exemplary embodiment of the invention.

In the embodiments disclosed above, referred to hereinafter as a homogenous design, the light guide layer and the injection facet layer have matching refractive indices. As illustrated in FIG. 30*a*, the rays at the edge of the injected ray bundle will interact with the injection layer more frequently over a given propagation distance, and thus will be the first to couple out of the guide, limiting the efficiency and the concentration that can be achieved in a homogenous system. According to an embodiment described herein below, material characteristics of the light guide layer and/or the injection layer of a light guide apparatus 3000-1 are utilized to redirect those rays propagating with a high angle to travel down the guide at a lower angle relative to the guiding axis, as illustrated in FIG. 30*b*. This allows light to be contained in the guide layer for a longer propagation distance, and thus increases the concentration that the light guide apparatus can achieve. A key feature of the instant embodiment is an axial (y-direction) refractive index variation. Axial index variation is advantageously used for injection feature designs that provide small deflections to rays striking the injection layer. The rays injected closer to the center of the incident light bundle will be trapped in the injection layer, and will interact with the injection layer repeatedly until they pick up enough angular deflection to overcome the axial index variation. The axial index variation will then deflect these rays down the axis of the guide. If the interaction with the injection features imparts too strong an angular deflection, then these rays will not travel at shallow enough angles to make this practical.

Figure 31:
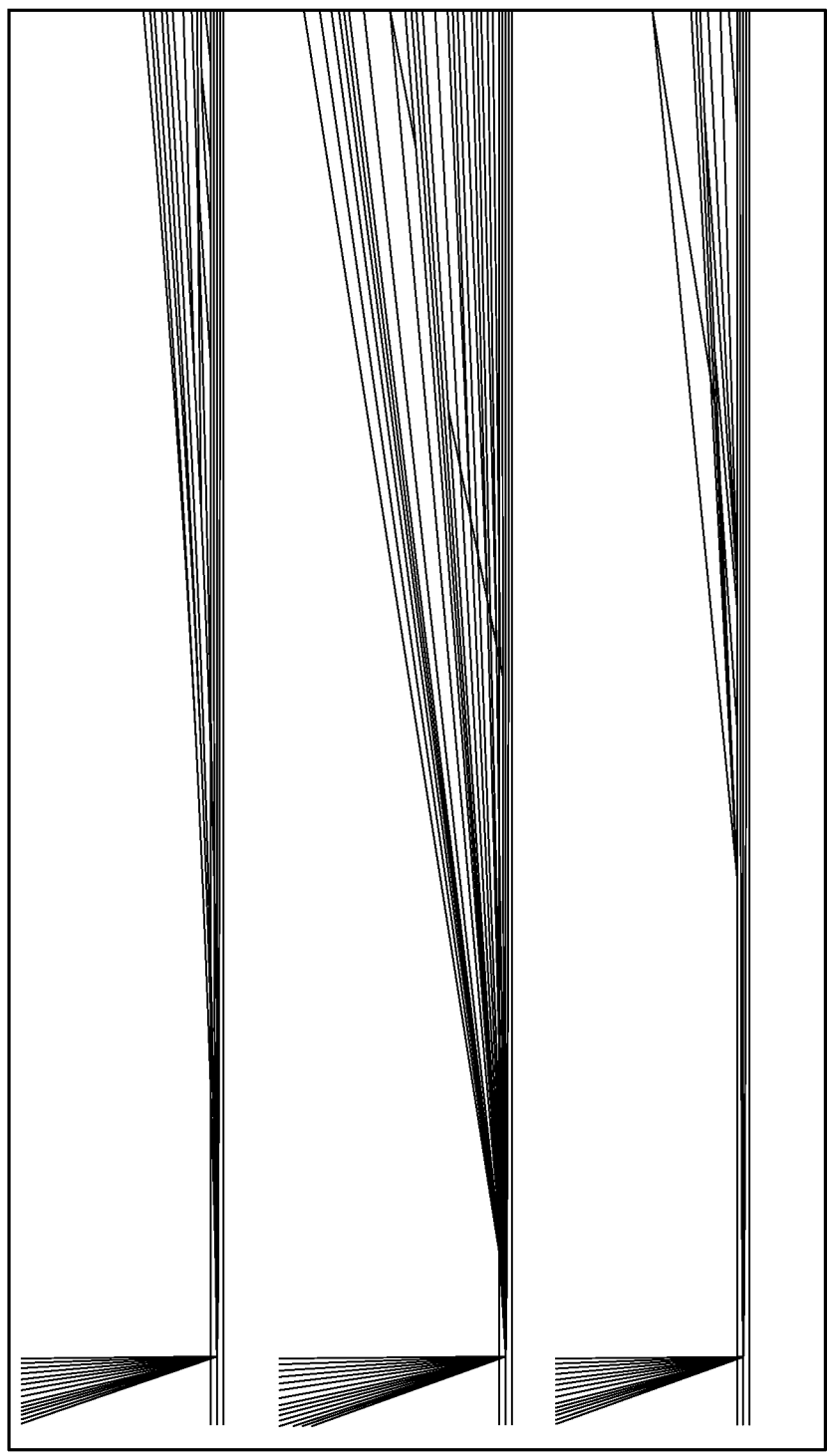
FIG. 31: For the mismatched layer designs, the index contrast has an ideal value depending on the system geometries. The refractive index of the guide layer in all cases is 1.55. a) the ideally designed case, in which the refractive index of the dimple layer is 1.572; b) the injection layer refractive index is 1.562, and the system behaves more similarly to the homogenous design; c) the injection layer refractive index is 1.592, showing the rays trapped within the injection layer, according to illustrative aspects of the invention.

In a first aspect of the axial index variation, illustrated in FIG. 30b, the injection facet layer 3010 is a light-transmissive medium that has a discrete higher refractive index, $n_2$, than the refractive index, $n_1$, of the light guide layer 3012. This will create an interface that will deflect light travelling with a high angle more directly down the guide. The index mismatch Δn in this design causes a Fresnel interface between the two layers, which can cause a substantial Fresnel reflection if the index mismatch is too large due to the shallow incidence angles. This Fresnel reflection can result in light being trapped in the injection facet layer where it will continue to increase in angular spread, and thus will be lost from the guide sooner. The index contrast is ideally designed to be strong enough to deflect the injected rays at the edge of the injection aperture nearly directly down the guide layer, as shown in FIG. 31a. This will correspond to the edge rays of the injected aperture being just slightly above the critical angle. The ideal index contrast will thus be approximately $$n_{inject} \approx \frac{n_{Guide}}{\cos(\theta_{inj})}.$$

If the index contrast is substantially lower than this value, then the rays at the edge of the aperture will not be travelling at an optimally shallow angle, and the design will behave more like a homogenous design with lower achievable concentrations, as shown in FIG. 31b. If the index contrast is higher than this value, the injected light will be entirely contained within the guide layer initially. The higher index contrast will also cause a stronger Fresnel reflection at the interface. This will cause light to be trapped within the guide layer despite traveling at an angle greater than the critical angle, and thus it will interact with the injection layer more frequently, as shown in FIG. 31c. The system is designed to have a large portion of the injected light travelling at grazing incidence angles to the surface, so even moderately increased index contrast will cause Fresnel reflections to decrease the concentration achievable. Having an index contrast higher than the critical angle described above provides no benefit.

The ideal index contrast will change depending on the angular extent of the injected ray bundle. For example, for a 10° half angle injected ray bundle and a guide layer having an refractive index of 1.500, the injection layer would ideally have a refractive index of approximately 1.523. A higher index value will degrade performance, while a lower index than this will approach the homogenous design in performance.

The materials that can be used for the various components of the system are varied. In general the light guide layer should be highly transmissive and be durable to the high concentrations of solar radiation it will be exposed to. The guide layer may be made of a glass or optical grade plastic, depending on the configuration. The injection layer has the same requirements as the guide layer and additionally requires that small features can be manufactured with high precision and accuracy. The injection layer may be made of glass, plastic, or a silicone material, which transmit solar spectrum wavelengths.

Exemplary modeled system designs disclosed below incorporate materials that are feasible. The example systems utilize an acrylic lenslet array and a low index (TIR) layer modeled to be a perfectly transmissive material with a refractive index of 1.38. The low index layer is on the order of 25 um thick, so the actual absorption when passing through this layer is expected to be negligible. A glass guide layer was assumed to have a base index of 1.536 and a transmission of 99.8% over 10 mm. Both of these assumptions are within the bounds of available materials. All edges of the dimpled features were modeled as having fillet radii of 1 um, which is achievable by high precision processes.

In a first exemplary aspect, a mismatched material is attached to the glass substrate. This material was modeled to have a refractive index of 1.570 with transmission of 99.8% over 10 mm. The lenslet and injection geometry were optimized for a 2 mm thick guide layer, with the guide being 600 mm long (300× geometric concentration). An extruded secondary concentrator, assumed to be made of the same glass as the guide layer, was added to the output end of the system to increase further potential concentration. The output face of this concentrator was 0.8 mm, which corresponds to a geometric concentration of 750×. This system optimized to a lenslet aperture of 1.05 mm along the guiding axis and 1.5 mm perpendicular to the guiding axis with the lens apex 0.35 mm farther down the guiding axis from the center of the lens aperture. Each injection facet was 80 um tall and 800 um wide, and thus the wedged step region was 18.9 mm long with a wedge angle of 0.25°. This yielded an optical efficiency of 89% at the end face of the guide and an optical efficiency at the output face of the secondary concentrator of 86%.

Figure 32:
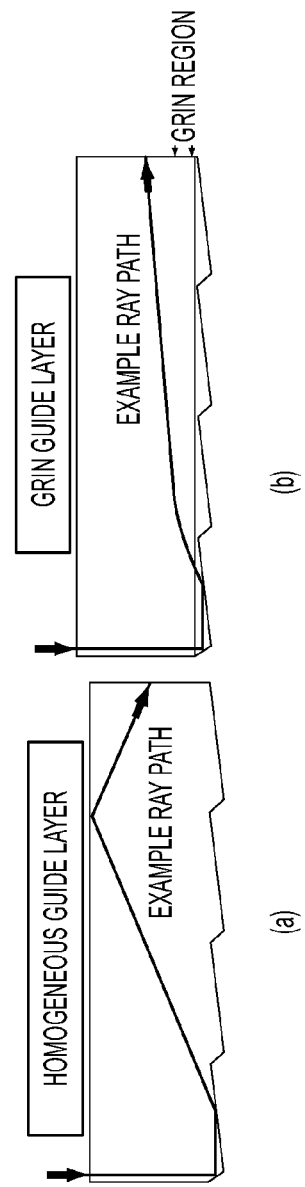
FIG. 32: a) schematic cross sectional view of a light guide apparatus guide layer and injection layer having a homogeneous index of refraction, according to an embodiment of the invention; b) schematic cross sectional view of a light guide apparatus guide layer and injection layer having an axially varying gradient index of refraction, according to an exemplary embodiment of the invention.

In a second aspect of the axial index variation apparatus 3000-2, illustrated in FIG. 32, an axial (y-direction) gradient index (a-GRIN) is used to direct light more directly down the guide layer 3012. This also reduces the number of interactions with the injection facet layer 3010, and thus causes light to travel farther down the guide before coupling out and being lost. A comparison of an example ray path for a homogenous design and the gradient index design is shown in FIGS. 32a, b. This allows a longer guide that will still efficiently couple sunlight onto the receiver, and thus increase the possible concentration of the optical system. This variation avoids the Fresnel interface described in the first variation, and thus can maintain an index difference limited only by the refractive index change across the gradient that can be produced in the guide layer.

In a second exemplary aspect, the guiding layer has an axial gradient such that the refractive index at the bottom surface of the guide layer (adjacent the injection layer) and at the top surface of the guide layer is higher than in the central region of the guide layer) i.e., the axial gradient decreases towards the central axial region of the guide layer). The guide layer material was modeled to have a base refractive index of 1.536 with a gradient of 0.03 diffused into both sides (bottom and top), so that both surfaces (bottom and top) had a refractive index of 1.563. The entire guide layer was modeled as having a constant transmission of 99.8% over 10 mm. The lenslet and injection geometry were optimized for a 2 mm thick guide layer, with the guide being 600 mm long (300× geometric concentration). An extruded secondary concentrator, assumed to be made of the same glass as the homogenous guide layer, was added to the end of the system to increase further potential concentration. The output face of this concentrator was 0.8 mm, which corresponds to a geometric concentration of 750×. This system optimized to a lenslet aperture of 1.05 mm along the guiding axis and 1.5 mm perpendicular to the guiding axis with the lens apex 0.35 mm farther down the guiding axis from the center of the lens aperture. Each injection facet was 80 µm tall and 800 µm wide, and thus the wedged step region was 18.9 mm long with a wedge angle of 0.25°. This yielded an optical efficiency of 89% at the end face of the guide and an optical efficiency at the output face of the secondary concentrator of 88%.

The depth of the axial gradient is optimally a small fraction of the total guide layer thickness. The gradient layer should be thick enough that it can be produced uniformly over the entirety of the guide layer. A thicker gradient will decrease the propagation distance for rays ejected at a very shallow angle, and thus the light guide performance will suffer noticeably for gradients exceeding about 10% to 20% of the guide width.

The strength of gradient required will depend on the size of the injected ray bundle. For most designed systems, the strength of the gradient will be similar to the ideal index mismatch, and thus be approximately 0.02 to 0.03, depending on the effective angular extent of the injection. The index must be higher at the edge of the guide, since, if the edge is of lower index, this will actively degrade the performance relative to the homogenous guide layer.

As discussed herein above for the other disclosed embodiments, the lens array of the system may be comprised of either refractive lenslets or reflective mirrors (collectively, lenslets). Lenslet material may be anything that effectively transmits the solar spectrum and can be machined into a precise shape. Typical refractive index values are 1.45 to 1.6. For a reflective system, any refractive index of the lenslet layer is feasible as long as the surface shape can be produced precisely. For a refractive system, a higher index causes no loss in performance, while a lower index will also cause no loss in performance, though the weaker refraction will likely make machining more difficult due to larger sag required.

Each individual lenslet must focus light onto an injection face. In exemplary aspects, each individual lenslet was designed to have a focal length of approximately 3 mm, ranging from 1 mm to 4 mm depending on the thickness of the various layers of the system. Designs that are thinner than 1 mm are theoretically possible, but the small precise features required to scale down the design are difficult to produce using current manufacturing methods, and the solar cell at the output face becomes more difficult to manufacture in such a thin strip. Making the design thicker is also possible, but will make the design heavier, and it must be proportionally longer to gain the desired concentration. The absorption loss will thus increase for the thicker guide and reduce the optical efficiency. The surface shape of the lenslets is designed to create as small a focal spot at the injection face as possible. This allows the system to tolerate some misalignment or pointing error without losing efficiency. For a refractive system with lenslet index of approximately 1.5, this corresponds to a conic constant of approximately −0.45, while for a reflective system the shape is nearly parabolic. These lenslets can be made to have different shapes, and can even be made to have spherical shapes, yet this will increase the size of the focal spot. If the focal spot of the lenslet is not ideal, the acceptance angle of the system will be reduced, and if the lens shape deviates enough from the ideal shape, light will miss the injection face and be lost even with no pointing error.

The shape of the aperture is ideally a shape that can be tessellated, like a rectangle or hexagon. The shape of the aperture and angle of the injection facet will effect the angular spectrum in the guide layer. This often results in the apex of the lens being offset in order to achieve optimal performance. Other shapes may prove more friendly to manufacturing processes, such as the laser writing process, which is limited in the amount of sag with which the lenses can be made accurately. This may result in a complicated aperture shape such as shown in FIG. 19, with a small degree of concentration loss. If the lenses cannot tolerate discontinuities, flush lenses may be used where the center of the aperture corresponds to the apex of the lens, yet this will reduce the concentration that can be attained.

In order to minimize the effective injection numerical aperture, the light will ideally be injected with the center of the ray bundle 90° from the incident radiation. This dictates an optimal relation between the lenslet geometry and the injection face angle which depends on the refractive index of the injection feature layer. All rays must strike the injection face at an angle greater than the critical angle for the air/injection layer interface in order to maintain TIR and get coupled into the guide. If the injection angle of the central ray is not 90° from the incident direction, then the effective angular spread will be increased by the added angle required on the injection face to maintain total internal reflection and inject the entire ray bundle injected by the lenslets.

The instant mismatched index embodiments are particularly advantageous when paired with the wedged stepped dimple design as disclosed in co-owned U.S. Pat. No. 7,817,885. This geometry primarily spreads light vertically, and every interaction with the dimple layer only increases the angle of propagation by a small amount. This allows rays that are contained within the gradient or mismatched injection layer to increase in angle slightly until they reach the critical angle where they can escape from the injection layer, and will be coupled into the guide layer at a very shallow angle. Axial index variation can also improve other dimple layer designs.

Figure 33:
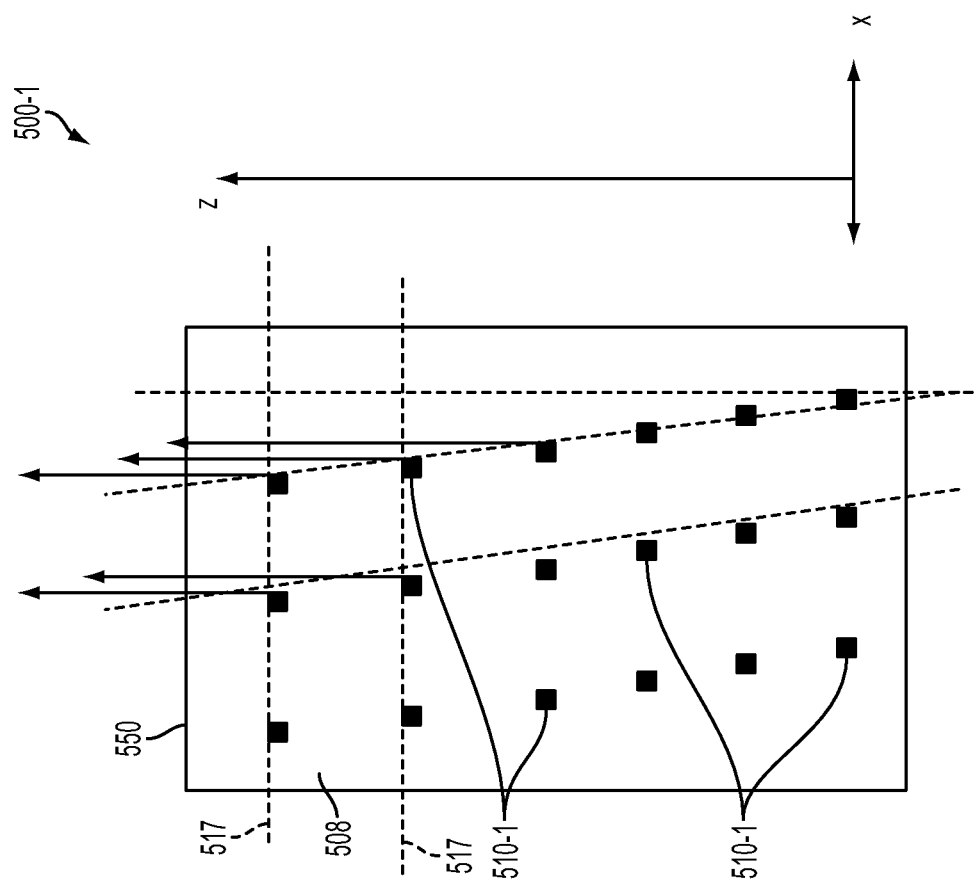
FIG. 33 is a schematic top plan view of a planar section of a stepped light guide according to an illustrative aspect of the invention.
Figure 34:
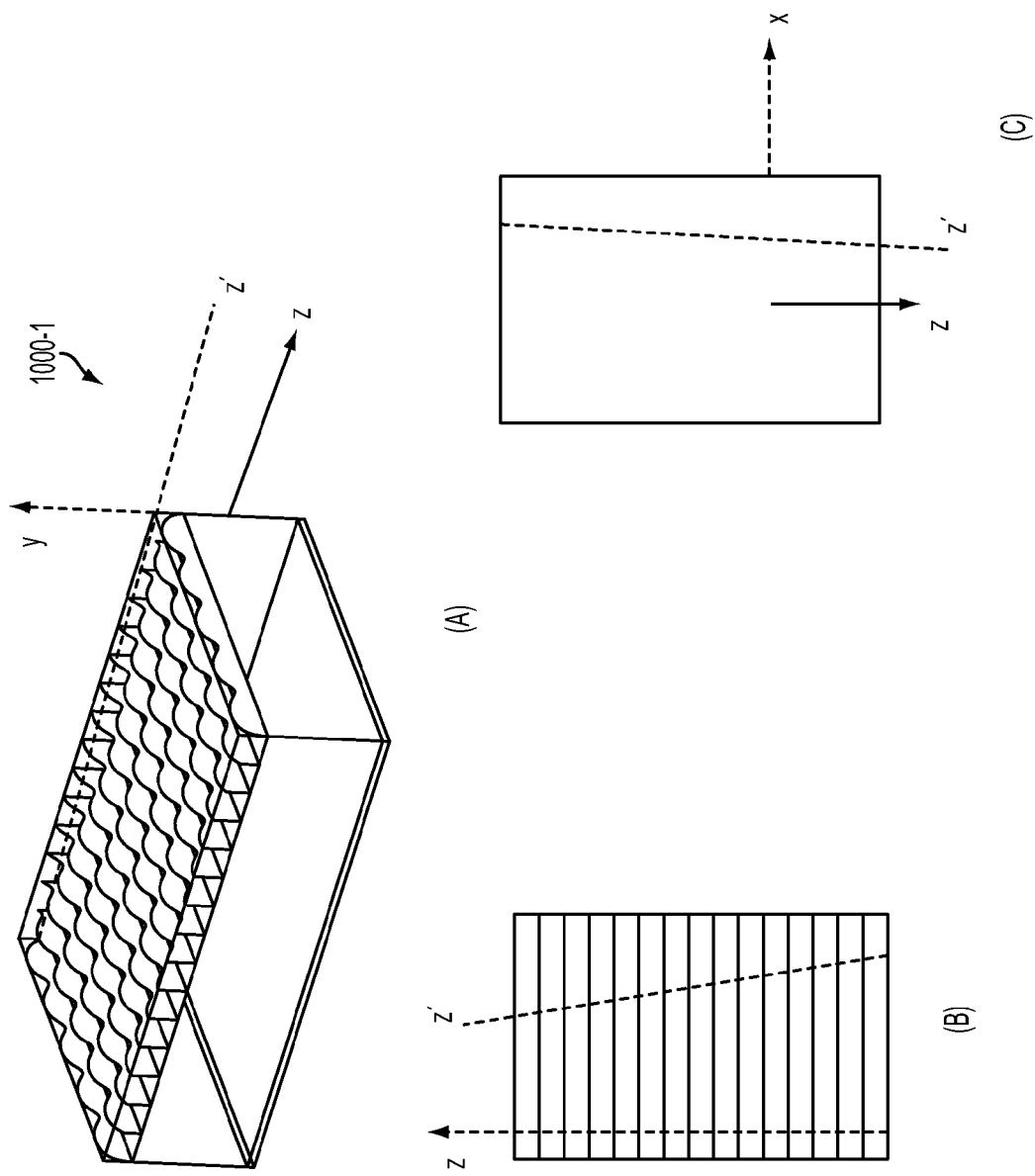
FIGS. 34(A-C) illustrate a stepped light guide system in perspective, a top view of the stepped, tiled lenslet array, and a bottom view of the stepped light guide component, respectively; according to illustrative aspects of the invention.

FIG. 33 illustrates in a top plan view an exemplary component lateral stepped light guide 500-1. The guide 500-1 includes a guide layer 508 that further includes a first plurality of air prism type light injection elements 510-1 disposed in the bottom surface and extending inwardly therefrom at an angle to the surface. The light injection elements are stepped (staggered) in the z-direction in a first, respective z-x plane along lines (517) parallel to the side-end exit surface 550. FIG. 34(C) shows a similar view.

A stepped guide minimizes losses in the guide layer by positioning injection facets in a manner that they will not obstruct or divert any light already traveling down the guide. In order to efficiently use the volume of the guide layer, injection facets can be horizontally stepped in two or more vertically displaced and/or tilted planes. Injection facets are first stepped in the plane parallel with the light guide (horizontal step) as discussed above. Once the limit is reached for horizontal stepping, a step that is vertically displaced with respect to the guide layer can be introduced. The horizontal stepping is then repeated in this plane before another vertical step is made. This vertical integration allows the system to keep a maintain a thin profile without the injection facets obstructing any of the light.

Figure 35:
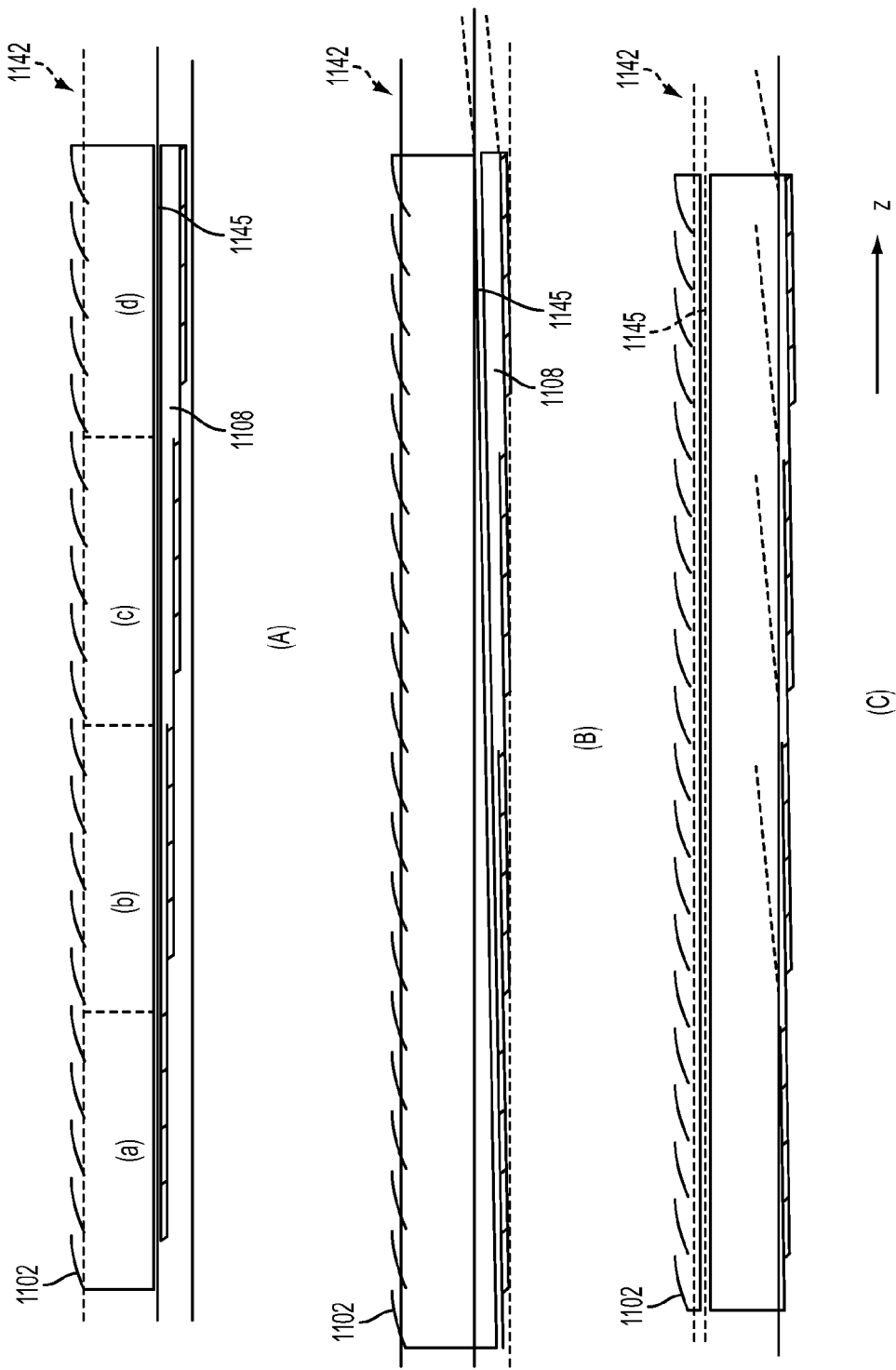
FIGS. 35(A-C) show side cross sectional views of alternative stepped light guide system configurations, according to illustrative aspects of the invention.

According to aspects of the invention, vertical steps that do not alter the functional design of individual elements may be implemented as shown in, e.g., FIGS. 35(A-C). In FIG. 35(C), for example, the lenslet plane is shown by dotted line 1142. A TIR medium layer 1145 separates the guide layer 1108 from the primary lens component 1102. The TIR medium layer is not tilted with respect to the lenslet plane; the horizontally stepped guide layers are tilted with respect to the lenslet plane; and, the horizontally stepped guide layers are not vertically displaced. Thus the guide layer is flat relative to the entire system. This is convenient for manufacturing purposes and lessens the constraint on total length, since this version is feasible only when the angle of the tilted steps is very small. As light propagates down the guide layer it will increase in angular spread as it bounces off of the non parallel surfaces and eventually leaks out if the guide is too long.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

We claim:

1. A light guide apparatus, comprising:
    a light guide component including a light guide layer section having an index of refraction $n_1$ and an injection layer section having an index of refraction $n_2$ disposed axially adjacent the light guide layer section, wherein $n_2$ is greater than $n_1$ by an amount $\Delta n$ greater than zero.

2. The light guide apparatus of claim 1, wherein $0.02 \leq \Delta n \leq 0.03$.

3. The light guide apparatus of claim 1, wherein $n_2 \approx n_1/\cos\theta_2$, where $\theta_2$ is the maximum angle between an edge ray of a ray bundle incident on the injection layer section and an optical propagation axis of the ray bundle incident on the injection layer section.

4. The light guide apparatus of claim 1, wherein the light guide layer section includes an axial gradient index $\Delta n_1$.

5. The light guide apparatus of claim 1, wherein the light guide layer section and the injection layer section are separate, co joined layers consisting of a light guide layer and an injection layer.

6. The light guide apparatus of claim 5, wherein $0.02 \leq \Delta n \leq 0.03$.

7. The light guide apparatus of claim 5, wherein $n_2 \approx n_1/\cos\theta_2$, where $\theta_2$ is the maximum half-angle between an edge ray of a ray bundle incident on the injection layer and a horizontal plane of the injection layer.

8. The light guide apparatus of claim 5, wherein the light guide layer includes an axial gradient index $\Delta n_1$.

9. The light guide apparatus of claim 8, wherein the axial gradient index $\Delta n_1$ decreases in the axial direction from at least one of a top and a bottom axial surface of the light guide layer adjacent the injection layer towards a center region of the light guide layer.

10. The light guide apparatus of claim 9, wherein the axial gradient index $\Delta n_1$ does not extend for more than 20% of the thickness of the light guide layer.

11. The light guide apparatus of claim 1, further comprising a TIR layer having an index of refraction $n_3$, wherein $n_3$ is less than $n_1$, disposed immediately axially adjacent the light guide layer section that is not adjacent the injection layer section.

12. The light guide apparatus of claim 1, further comprising a lens array disposed adjacent the light guide component.

13. The light guide apparatus of claim 5, wherein the light guide layer is one of a glass and a plastic material, and the injection layer is one of a glass, a thermoplastic, and a silicone material, that can transmit solar spectrum wavelengths.

14. The light guide apparatus of claim 5, wherein the injection layer includes at least a first plurality of injection elements that are stepped (staggered) in a z-axis-light propagation direction in a respective first plane.

15. The light guide apparatus of claim 14, further comprising at least a second plurality of light injection elements that are stepped in the z-axis-light propagation direction in a respective at least second plane.

16. A solar light guide, comprising
    a guide layer; and
    an injection facet layer interfaced thereto,
    wherein at least one of the guide layer and the injection layer has an axial gradient index (a-GRIN) of refraction, further wherein the guide layer has a higher refractive index than a refractive index of the injection layer.

* * * * *